US011238909B2

(12) United States Patent
    Durai et al.

(10) Patent No.: US 11,238,909 B2
(45) Date of Patent: Feb. 1, 2022

(54) APPARATUSES AND METHODS FOR SETTING OPERATIONAL PARAMETERS OF A MEMORY INCLUDED IN A MEMORY MODULE BASED ON LOCATION INFORMATION

(71) Applicant: MICRON TECHNOLOGY, INC., Boise, ID (US)

(72) Inventors: Elancheren Durai, Boise, ID (US); Quincy R. Holton, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/541,097

(22) Filed: Aug. 14, 2019

(65) Prior Publication Data

US 2021/0050041 A1   Feb. 18, 2021

(51) Int. Cl.

| G11C 7/22 | (2006.01) |
|---|---|
| G11C 8/12 | (2006.01) |
| G06F 13/16 | (2006.01) |
| G11C 11/4074 | (2006.01) |
| G06F 13/20 | (2006.01) |
| G11C 7/10 | (2006.01) |
| G11C 11/4096 | (2006.01) |
| G11C 11/4093 | (2006.01) |

(52) U.S. Cl.
CPC .......... *G11C 7/222* (2013.01); *G06F 13/1678* (2013.01); *G06F 13/20* (2013.01); *G11C 7/1075* (2013.01); *G11C 8/12* (2013.01); *G11C 11/4074* (2013.01); *G11C 11/4093* (2013.01); *G11C 11/4096* (2013.01)

(58) Field of Classification Search
CPC ......... G11C 7/222; G11C 7/1075; G11C 8/12; G11C 11/4074; G06F 13/1678; G06F 13/20

See application file for complete search history.

(56) References Cited

U.S. PATENT DOCUMENTS

| 7,461,188 | B2 * | 12/2008 | Greeff ................. G06F 13/4086 |
|---|---|---|---|
| | | | 327/109 |
| 9,324,410 | B2 | 4/2016 | Arai |
| 10,529,390 | B1 * | 1/2020 | Satoh .................... G06F 3/0632 |
| 2003/0049949 | A1 * | 3/2003 | Abe ................... H01R 12/7094 |
| | | | 439/61 |

(Continued)

*Primary Examiner* — Mushfique Siddique
(74) *Attorney, Agent, or Firm* — Dorsey & Whitney LLP

(57) ABSTRACT

Apparatuses and methods for setting operational parameters of a memory based on location are disclosed. The operational parameters may include operational parameters for an input/output circuit. For example, operational parameters may be for output driver circuit impedance, equalization for input receiver circuits, termination impedance, as well as others. Location information is provided to a memory device and used for setting the operational parameter. A nominal operational parameter setting may be offset based on the location information, thereby tailoring the operational parameter of the memory device according to location in some examples. The location information may be memory slot address for location based on memory module location. The location information may be related to a location of a memory device within a sub-system. The location information may be provided to unused terminals of a memory device, for example, unused data terminals in some examples.

23 Claims, 12 Drawing Sheets

(56) References Cited

U.S. PATENT DOCUMENTS

| | | | |
|---|---|---|---|
| 2005/0044302 A1* | 2/2005 | Pauley | G11C 5/066 711/1 |
| 2005/0138267 A1* | 6/2005 | Bains | G11C 7/1051 711/100 |
| 2006/0179333 A1* | 8/2006 | Brittain | G11C 5/143 713/320 |
| 2010/0030934 A1* | 2/2010 | Bruennert | G06F 13/4086 710/104 |
| 2012/0042148 A1* | 2/2012 | Grunzke | G11C 7/20 711/211 |
| 2014/0040568 A1* | 2/2014 | Lee | G06F 12/00 711/154 |
| 2015/0067292 A1* | 3/2015 | Grunzke | G11C 7/1057 711/170 |
| 2016/0259385 A1* | 9/2016 | Tang | H03K 19/018557 |
| 2017/0099050 A1* | 4/2017 | Lee | H03K 19/0005 |
| 2020/0159683 A1* | 5/2020 | Durai | G11C 7/1066 |

* cited by examiner

| Location Info Value | Channel# | Slot# |
|---|---|---|
| 0 | 0 | 0 |
| 1 | 0 | 1 |
| 2 | 1 | 0 |
| 3 | 1 | 1 |
| 4 | 2 | 0 |
| 5 | 2 | 1 |
| 6 | 3 | 0 |
| 7 | 3 | 1 |
| A | 4 | 0 |
| B | 4 | 1 |
| C | 5 | 0 |
| D | 5 | 1 |

FIG. 12

APPARATUSES AND METHODS FOR SETTING OPERATIONAL PARAMETERS OF A MEMORY INCLUDED IN A MEMORY MODULE BASED ON LOCATION INFORMATION

BACKGROUND

Semiconductor memories are used in many electronic systems to store data that may be retrieved at a later time. As demand has increased for electronic systems to be faster, have greater memory capacity, and additional features, semiconductor memories that may be accessed faster, store more data, and include new features have been continually developed to meet the changing needs. Each succeeding generation of semiconductor memories are developed with the aim of improving performance of the memories in the electronic systems.

Semiconductor memories are generally controlled by providing the memories with command and address signals, and clock signals. The various signals may be provided by a memory controller, for example. The command and address signals include memory commands and memory addresses that control the semiconductor memories to perform various memory operations at memory locations corresponding to the memory addresses, for example, a read operation to retrieve data from a memory, and a write operation to store data to the memory. The read data and write data may be provided between the controller and memories with known timing relative to one or more of the clock signals, for example, system clock signals CK_t and CK_c.

In order to receive and provide the various signals for optimal performance, the memories may perform calibration operations, and operational parameters related to the operation of various circuits of the memories are set accordingly. A memory controller coupled to the memories may provide various commands to cause the memories to perform the calibration operations and set the operational parameters.

However, as more operational parameters are set and calibration operations take longer, greater burden is placed on the memory controller. Moreover, there are limits to the ability to fine tune the operational parameters of the memories when working with a large number of memories, for example, accessing a memory that includes several memory modules, each of which includes many memory devices. For example, in such a memory, the memory modules may be located at different distances from the memory controller. As a result, each of the different memory modules (and the memory devices on the respective modules) may operate under different operating conditions, for example, different signal line impedance, different timing and voltage conditions, etc. In systems with high clock speeds and relatively low voltages, memory performance may vary significantly based on the location of the memory module/memory devices relative to the memory controller.

While the calibration operations and setting operational parameters accordingly mitigate some aspects of the performance difference across the memory modules, accommodating such a wide range of operating conditions (e.g., due to the different locations of the memory modules/memory devices) may nonetheless result in non-optimal memory performance.

BRIEF DESCRIPTION OF THE DRAWINGS

FIG. 12 is a diagram of location information values and corresponding location according to an embodiment of the disclosure.

DETAILED DESCRIPTION

Figure 1:
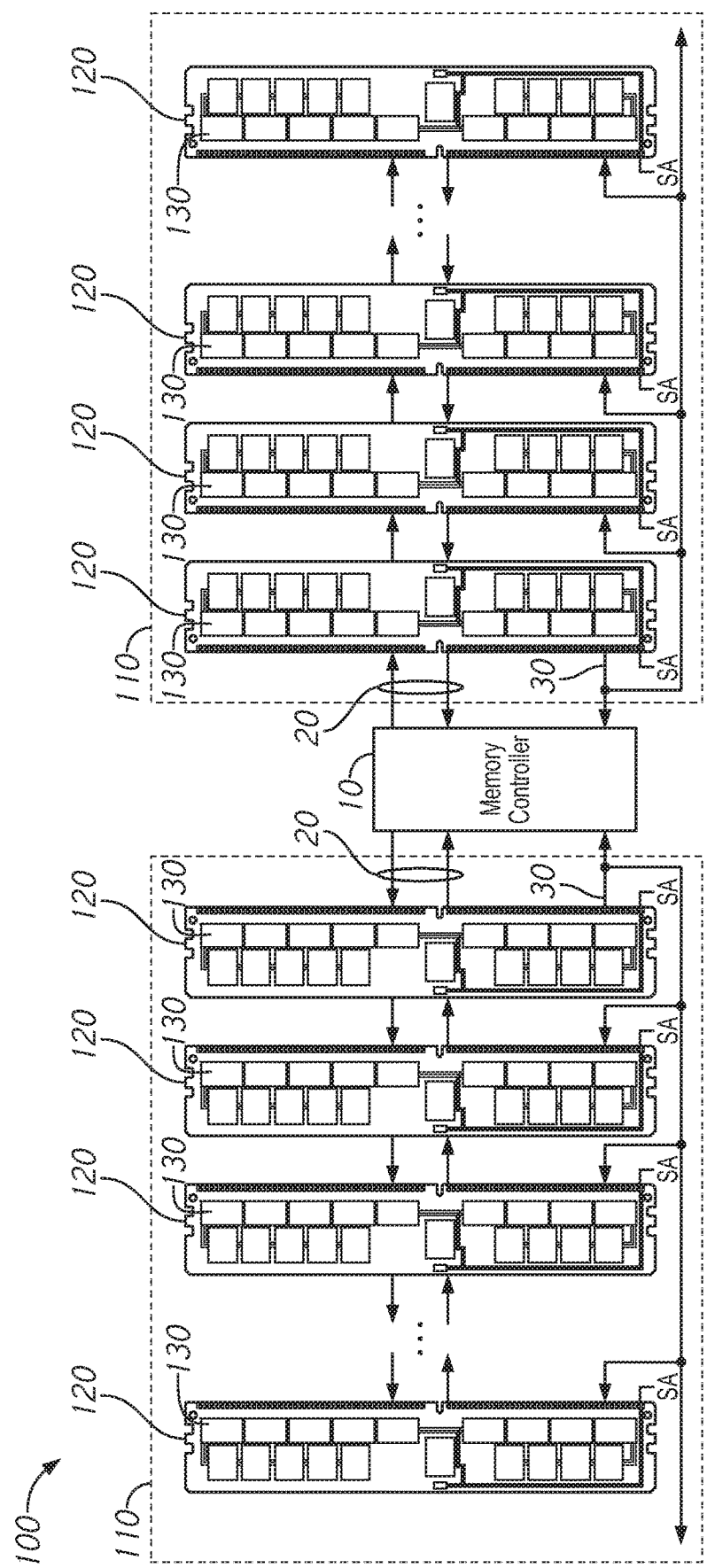
FIG. 1 is a block diagram of an apparatus according to an embodiment of the disclosure.

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Embodiments of the disclosure include examples of setting operational parameters of a memory based (at least in part) on location information. For example, in some embodiments of the disclosure, operational parameters of a memory are set based on location information associated with location of a memory module in which the memory is included. The location of the memory module may be relative to another device, for example, such as a memory controller, processing unit, etc. The location of the memory module may be indicated by location information provided to the memory module. In some embodiments, the location information is slot address.

In some embodiments of the disclosure, operational parameters of a memory are set based on location information associated with location of a memory included in a memory module. The location of the memory may be relative to regions of the memory module, for example, upper row region, lower row region, left region, right region, etc. The location information may be provided to the memory on the memory module and used to set the respective operational parameters.

In some embodiments of the disclosure, operational parameters of a memory are set based on location information programmed in the memory. For example, in some embodiments of the disclosure, the location information may be programmed in mode registers included in the memory. The memory uses the programmed location information to set operational parameters accordingly. The location information may be provided by a memory controller.

Embodiments of the disclosure are not mutually exclusive. It is not intended that examples of embodiments of the disclosure described are limited to the specific details provided. Features and/or configurations of one embodiment of the disclosure may be combined with features and configurations of other embodiments of the disclosure without departing from the scope of the disclosure.

Examples of operational parameters that may be set based on location information include parameters associated with the input and output of signals, for example, output driver impedance, input receiver impedance, on-die termination, equalization for data receiver circuits. Other operational parameters may be set based on location information as well.

Based on the location information, the operational parameters are adjusted accordingly. Code logic circuits on the memory devices of the memory module may be provided the location information (e.g., decoded location information). Based on the location information, the code logic circuit provides internal control signals to set the operational parameters accordingly. In an embodiment of the disclosure, the code logic circuit includes a look up table that includes operational parameter information. The operational parameter information may be accessed according to the location information. The operational parameter information is used by the code logic circuit to provide the internal control signals.

In an example embodiment, the code logic circuit provides the internal control signals by adjusting nominal internal control signals. Note, this is a particular approach to providing the internal control signals and the internal control signals are not limited to being based on nominal internal control signals. For example, the code logic circuit may provide the internal control signals based on operational parameter information of the look up table. Various example embodiments of the disclosure may be described as providing internal control signals based on adjusting nominal internal control signals. However, the scope of the disclosure is not limited to providing internal control signals in this manner.

FIG. 1 is a block diagram of an apparatus 100 according to an embodiment of the disclosure. The apparatus 100 includes memory 110 and memory controller 10. The memory controller 10 is coupled to the memory 110 through a memory bus 20. The memory bus includes signal lines for communicating information between the memory controller 10 and the memory 110. For example, the memory bus 20 may include signal lines for communicating control information between the memory controller 10 and the memory 110, such as memory commands, configuration information, etc. The memory bus 20 may also include signal lines for communicating data between the memory controller 10 and the memory 110, such as read data from the memory to the memory controller, write data from the memory controller to the memory, control information provided to the memory, etc. The signal lines of the memory bus 20 may be arranged as memory channels, in some embodiments of the disclosure. Each of the memory channels may be used to communicate with a respective portion of the memory 110, and the different portions of memory 110 may be independently accessible. In some embodiments of the disclosure, the memory controller 10 is included in a system processor (e.g., central processing unit). In some embodiments of the disclosure, the memory controller 10 is included with the memory 110 in a system memory, for example, as an interface device, controller device, or the like.

The memory 110 includes memory modules 120. The memory modules 120 are coupled to the memory bus 20 through a respective connector (e.g., memory slot). The connectors may be arranged adjacent to the memory controller 10 with some connectors closer to the memory controller 10 while others connectors are farther away. As a result, the connectors have a respective distance relative to the memory controller 10. Each of the connectors have an associated connector address (e.g., memory slot address) that identifies the particular connector, and consequently, conveys a location of the respective connector, for example, relative to the memory controller. The memory slot addresses may be represented by one or more bits. The memory slot address may be hard wired by coupling each bit of the address to a voltage level representing the state of the bit (e.g., a "1" bit provided by a high level voltage and a "0" bit provided by a low level voltage) in some embodiments of the disclosure.

Each of the memory modules 120 is provided location information associated with the respective connector that indicates a respective location of the connectors (and the associated memory module). For example, with the connectors arranged with some closer to the memory controller 10 and others farther away, the location information may indicate a respective location of the connector (and associated memory module 120) relative to the memory controller. In some embodiments of the disclosure, the connector address (e.g., memory slot address) is provided to the respective memory module 120 as the location information. The memory slot address may correspond to a relative physical location of the respective connector and the associated memory module 120, for example, the location of a respective memory module 120 relative to the memory controller 10. Additionally or alternatively, the location information may be provided to the memory modules 120 by the memory controller 10 in some embodiments of the disclosure. Greater or fewer memory modules 120 may be included in the memory than shown in FIG. 1. Moreover the memory modules may be arranged in a different manner than shown in FIG. 1.

The memory modules 120 include respective memory devices 130. The number of memory devices 130 on the memory modules 120 may be greater or fewer than that shown in FIG. 1, and the configuration of memory devices 130 on the memory modules 120 may be different than that shown in FIG. 1 without departing from the scope of the disclosure. The memory devices 130 are coupled to the memory bus 20 through signal lines and edge connectors of a module substrate for communication with the memory controller 10. The memory devices 130 may be attached to the module substrate by solder attachment between external terminals of the memory devices 130 and conductive pads of the module substrate. The solder attachment provides a conductive path between the external terminals of the memory devices 130 and signal lines of the module substrate via the conductive pads.

The memory devices 130 may store data written to them, such as through write operations, and can provide the stored data, such as through read operations. In some embodiments of the disclosure, the memory devices 130 include dynamic random access memory (DRAM). The memory devices 130 may be controlled by the memory controller 10 to perform various memory operations, for example, access operations, refresh operations, training operations, configuration operations, calibration/tuning operations, etc.

The memory modules 120 may each further include a respective configuration circuit 135. The configuration circuit 135 may include information regarding the memory module, for example, information about the module type, data channel configuration, timing for the memory controller to be configured correctly, etc. In some embodiments of the disclosure, the configuration circuit 135 may include an electrically erasable programmable read-only memory (EEPROM). The memory devices 130 and the configuration circuit 135 may be attached to the module substrate, for example, by soldering external terminals of the memory devices 130 and the configuration circuit 135 to conductive pads of the module substrate. The module substrate may be a printed circuit board in some embodiments of the disclosure.

The memory 110 may be coupled to a memory management bus 30. The memory management bus 30 includes signal lines over which information may be communicated by the memory 110. For example, the memory modules may use the memory management bus 30 to provide configuration information to the memory controller 10 (e.g., the memory devices and the configuration circuit on the modules). In some embodiments of the disclosure, the memory management bus 30 may include a System Management Bus (SMBus). In some embodiments of the disclosure, the memory management bus 30 may include an Inter-Integrated Circuit bus ($I^2C$).

Location information (e.g., memory slot address) may be provided to each of the memory devices 130 and the configuration circuit 135 in some embodiments of the disclosure. In some embodiments of the disclosure, operational parameters for the memory devices 130 and/or circuits of the memory devices 130 of the memory modules 120 of the memory 110 may be based on the respective location (as indicated by the location information) relative to the memory controller 10.

Figure 2:
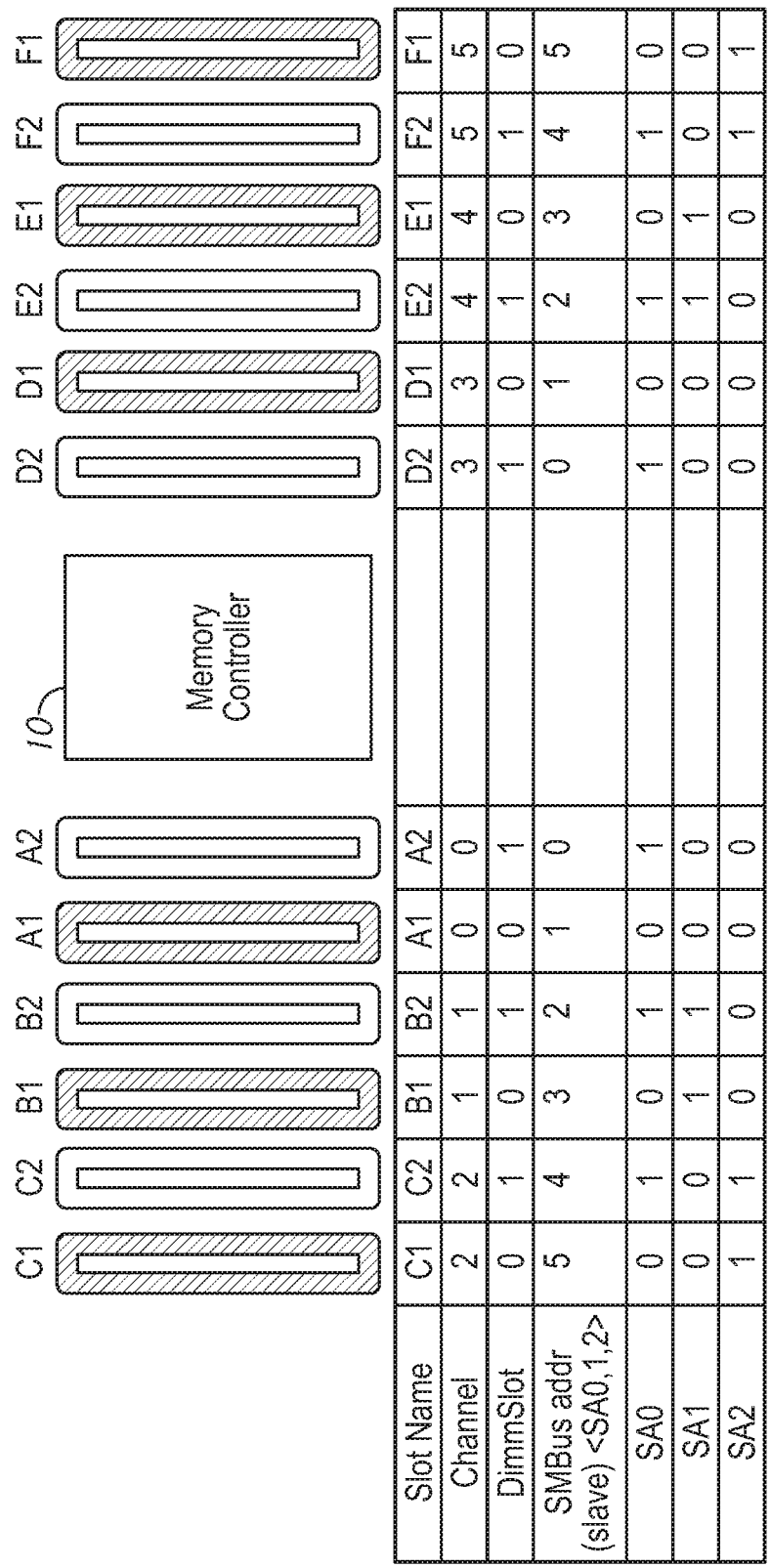
FIG. 2 is a layout diagram for an apparatus that includes a memory controller 10 and memory slots.

FIG. 2 is a layout diagram for an apparatus that includes a memory controller 10 and memory slots A1, A2, B1, B2, C1, C2, D1, D2, E1, E2, F1, and F2, in which memory modules may be located to be coupled to the memory controller 10. In some embodiments of the disclosure, the layout illustrated by FIG. 2 may be used for the apparatus of FIG. 1.

The memory slots are arranged to provide 6 channels (channels 0-5) for memory. Channel 0 includes memory modules located in memory slots A1 and A2; channel 1 includes memory modules located in memory slots B1 and B2; channel 2 includes memory modules located in memory slots C1 and C2; channel 3 includes memory modules located in memory slots D1 and D2; channel 4 includes memory modules located in memory slots E1 and E2, and channel 5 includes memory modules located in memory slots F1 and F2. Each of the slots is associated with a respective memory slot address SA2-0. For example, memory slots A2 and D2 are both associated with the memory slot address "001"; memory slots A1 and D1 are both associated with the memory slot address "000"; memory slots B2 and E2 are associated with the memory slot address "011"; memory slots B1 and E1 are associated with the memory slot address "010"; memory slots C2 and F2 are associated with the memory slot address "101"; and memory slots C1 and F1 are associated with the memory slot address "100."

As previously described, the memory slot address may correspond to a relative physical location of a respective memory module (or memory slot). For example, in FIG. 2, the memory slot address "001" corresponds to the memory slots physically closest relative to the memory controller 10, and the memory slot address "100" corresponds to the memory slots physically farthest relative to the memory controller 10. Thus, memory modules located in memory slots A2 and D2 will be physically the closest to the memory controller 10 and memory modules located in memory slots C1 and F1 will be physically farthest from the memory controller 10.

The location of a memory module relative to the memory controller 10 can affect the performance of the module. For example, the relative distance of a memory module to the memory controller 10 can affect the timing of signals between the memory module and the memory controller 10 due to line impedance. Generally, the farther away a memory module (and the greater the line impedance) the greater the signals are delayed during propagation between the memory module and memory controller. In contrast, the closer a memory module (and the lower the line impedance) the less the signals are delayed during propagation between the memory module and memory controller. The varying timing of the signals between the memory controller and respective memory modules can negatively impact the overall performance of the memory.

In various embodiments of the disclosure, memory modules and/or memory devices of a memory module included in a memory (e.g., memory 110 of FIG. 1) may be tuned based on location information.

For example, in some embodiments of the disclosure, one or more of the memory devices on a memory module may have various operational parameters set based on information that indicates the relative location of the memory module (e.g., relative to a memory controller). In some embodiments of the disclosure, one or more of the memory devices on a memory module tune (e.g., set operational parameters) themselves based on memory slot address associated with the memory slot in which the memory module is located. In some embodiments of the disclosure, one or more of the memory devices on a memory module tune themselves based on location information associated with location of a memory device included in a memory module (e.g., upper row of memory devices, lower row of memory devices, etc.). In some embodiments of the disclosure, operational parameters of a memory are set based on location information programmed in the memory (e.g., programmed in mode registers of the memory).

Figure 3:
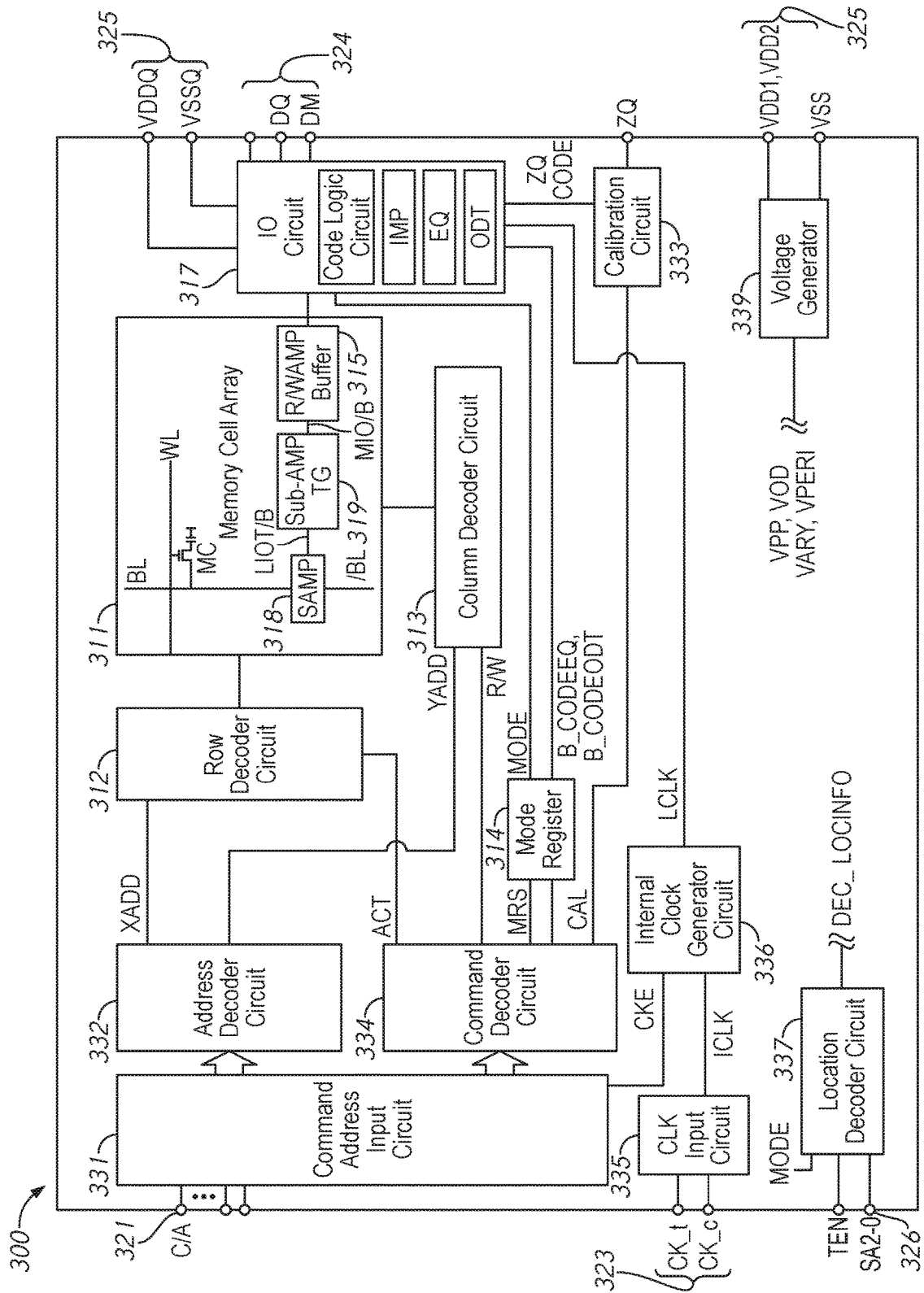
FIG. 3 is a block diagram of a semiconductor device according to an embodiment of the disclosure.

FIG. 3 is a block diagram of a semiconductor device 300 according to an embodiment of the disclosure. The semiconductor device 300 may be a dynamic random access memory (DRAM) in some embodiments of the disclosure. The semiconductor device 300 includes a memory cell array 311. The memory cell array 311 includes a plurality of word lines WL and a plurality of bit lines BL and /BL that intersect with each other, with memory cells MC disposed at the intersections. The WL may be driven by word drivers included in a row decoder circuit 312. For clarity, only one WL, BL, /BL, and MC are shown in FIG. 3. Selection of a word line WL is carried out by the row decoder circuit 312, and selection of the bit line BL is carried out by a column decoder circuit 313. Sense amplifiers 318 are coupled to corresponding bit lines BL and /BL and coupled to local I/O line pairs LIOT/B. Local IO line pairs LIOT/B are coupled to main IO line pairs MIOT/B via transfer gates TG 319 which function as switches to read/write amplifiers and buffers 315.

Turning to the explanation of a plurality of external terminals included in the semiconductor device 300, the plurality of external terminals includes command and address terminals 321, clock terminals 323, location information terminals 326, data terminals 324, and power supply terminals 325.

The command and address terminals 321 are provided with command and address signals C/A. Addresses provided to the command and address terminals 321 are transferred via a command/address input circuit 331 to an address decoder circuit 332. The address decoder circuit 332 receives the address signals and provides a decoded row address signal XADD to the row decoder circuit 312, and a decoded column address signal YADD to the column decoder circuit 313. Commands provided to the command and address terminals 321 are provided to a command decoder circuit 334 via the command/address input circuit 331. The command decoder circuit 334 decodes the command signals to provide various internal command and control signals. For example, the internal commands may include a row command signal to select a word line and a column command signal, such as a read command or a write command, to select a bit line. In another example, internal control signal B_CODEEQ may be provided by the command decoder circuit 334 to an equalization circuit included in an input/output circuit 317 for setting a voltage reference level. In another example, internal control signal B_CODE-ODT may be provided by the command decoder circuit 334 to termination circuits included in an input/output circuit 317 for setting a termination impedance.

The location information terminals 326 are provided with location information SA2-0. In some embodiments of the disclosure, the location information terminals 326 may be included as part of the data terminals 324. For example, location information may be provided to data terminals that are not used during operation of the semiconductor device 300 (e.g., eight data terminals includes four unused data terminals for a ×4 data configuration). In some embodiments of the disclosure, the location information terminals 326 may be another unused terminal (e.g., TEN terminal, parity terminal, one of VSS or VDU terminals). Unused terminals other than the data terminals may be used for location information when, for example, all of the data terminals are used to provide and receive data (e.g., 8 data terminals and configured as a ×8 memory device). In some embodiments of the disclosure, the unused terminals may be configured to receive location information, for example, configured by setting a fuse/antifuse circuit during manufacturing of the memory device. In some embodiments of the disclosure, the location information is provided by hard wired location information to the unused data terminals. For example, in some embodiments of the disclosure, the unused terminals for receiving location information may be respectively coupled to (or provided) a first voltage (e.g., a high logic level voltage) or a second voltage (e.g., a low logic level voltage) to provide the location information.

The location information may be provided to a location decoder circuit 337 that provides decoded location information signals DEC_LOCINFO. The decoded location information signals DEC_LOCINFO may be indicative of the location of the semiconductor device 300 and may be used to set various operational parameters of the semiconductor device 300. For example, operational parameters for an input/output circuit may be set based on the decoded location information signals. In some embodiments of the disclosure, the DEC_LOCINFO may be the location information. In some embodiments of the disclosure, the location decoder circuit 337 is additionally or alternatively provided location information programmed in a mode register 314 and provides decoded location information signals based on the programmed location information. In some embodiments of the disclosure, the location decoder circuit 337 is omitted and location information may be provided to circuits of the semiconductor device 300. In such embodiments, DEC_LOCINFO may refer to the location information.

When an activation command is received and a row address is timely received with the activation command, and a column address is timely received with a read command, read data is read from a memory cell MC in the memory cell array 311 designated by these row address and column address. More specifically, the row decoder circuit 312 selects a word line WL indicated by the row address XADD so that the associated memory cell MC is subsequently connected to the bit line BL. The read data DQ is output externally from the data terminals 324 via a read/write amplifier 315 and an input/output circuit 317. Similarly, when the activation command is received and a row address is timely received with the activation command, and a column address is timely received with a write command, the input/output circuit 317 may receive write data DQ at the data terminals 324. The write data DQ is provided via the input/output circuit 317 and the read/write amplifier 315 to the memory cell array 311 and written in the memory cell MC designated by the row address and the column address.

The input/output circuit 317 may include an input receiver circuit and an output driver circuit. The input receiver circuit may receive data from the external data terminal (e.g., write data) and the output driver circuit may provide data to the external data terminal (e.g., read data). The input/output circuit 317 may further include a code logic circuit. The code logic circuit may provide code signals to various circuits included in the input/output circuit 317 to set input/output (IO) operational parameters (e.g., operating characteristics) of the input/output circuit 317. For example, the output driver circuit of the input/output circuit 317 may include impedance circuits that may be set by the code signals provided by the code logic circuit. The output driver circuit impedance may determine a drive strength of the output driver circuit. In another example, the input receiver circuit of the input/output circuit 317 may include equalization circuits that may be set by the code signals provided by the code logic circuit. The input/output circuit 317 may additionally or alternatively include termination circuits that may be set by the code signals provided by the code logic circuit. The input/output circuit 317, the input receiver circuit, and/or the output driver circuit of the input/output circuit 317 may include other circuits as well.

A mode register 314 stores parameters that may be programmed, for example, by a memory controller (e.g., memory controller 10) for setting operation of the semiconductor device 300 and/or circuits included in the semiconductor device 300 (e.g., mode register settings MRS). The mode register 314 provides mode signals MODE based on the stored parameters for operation of various circuits of the semiconductor device 300. For example, the mode signals MODE may be provided to the input/output circuit 317 for setting operation, for example, IO characteristics of the input/output circuit 317. In some embodiments of the disclosure, the mode register 314 is programmed with location information and/or information related to location information. As previously described, the location information programmed in the mode register 314 may be used for setting operational parameters in some embodiments of the disclosure.

The clock terminals 323 are provided with external clock signals CK_t and CK_c, respectively. These external clock signals CK_t and CK_c are complementary to each other and are provided to a clock input circuit 335. The clock input circuit 335 receives the external clock signals CK_t and CK_c and provides an internal clock signal ICLK. The internal clock signal ICLK is provided to an internal clock generator 336 and thus a phase controlled internal clock signal LCLK is provided based on the received internal clock signal ICLK and a clock enable signal CKE from the command/address input circuit 331. Although not limited thereto, a DLL circuit can be used as the internal clock generator 336. The phase controlled internal clock signal LCLK is provided to the input/output circuit 317 and is used as a timing signal for determining an output timing of the read data DQ. The internal clock generator 336 may provide the internal clock signal LCLK including a plurality of multiphase clock signals that have a phase relationship relative to one another. For example, the multiphase clock signals may have a 90 degree phase relationship, such as a phase 0 clock signal PH0 with a 0 degree phase, a phase 90 clock signal PH1 with a 90 degree phase, a phase 180 clock signal PH2 with a 180 degree phase, and a phase 270 clock signal PH3 with a 270 degree phase.

The power supply terminals 325 are provided with power supply voltages VDD1, VDD2, and VSS. These power supply voltages VDD1, VDD2, and VSS are provided to an internal voltage generator circuit 339. The internal voltage generator circuit 339 provides various internal voltages VPP, VOD, VARY, and VPERI, for example. The internal potential VARY is a potential that may be used by the sense amplifier 318, transfer gates 319 and/or read/write amplifiers 315. When the sense amplifier 318 is activated, the read data read out is amplified by driving one of the paired bit lines to a VARY level with the other one being driven to a VSS level. The internal potential VPERI may be used as a power supply potential for most of the peripheral circuits, such as the command/address input circuit 331. By using the internal potential VPERI having a lower potential than the external potential VDD as the power supply potential of these peripheral circuits, it may be possible to reduce power consumption of the semiconductor device 300.

The power supply terminals 325 are provided with power supply voltages VDDQ and VSSQ. These power supply voltages VDDQ and VSSQ are provided to the input/output circuit 317. The power supply voltages VDDQ and VSSQ may be the same voltages as the power supply voltages VDD2 and VSS that are provided to the power supply terminals 325, respectively. However, the dedicated power supply voltages VDDQ and VSSQ may be used for the input/output circuit 317 so that power supply noise generated by the input/output circuit 317 does not propagate to the other circuit blocks of device 300.

A calibration circuit 333 is provided a calibration signal CAL from the command decoder circuit 334. The calibration signal CAL is activated when the command signal COM indicates a calibration command. When the calibration signal CAL is activated, the calibration circuit 333 starts a calibration operation to generate code signals ZQCODE.

A calibration terminal ZQ is coupled to the calibration circuit 333. When the calibration circuit 333 is activated by the calibration signal CAL, the calibration circuit 333 performs a calibration operation by referencing an impedance of an external reference resistor that may be coupled to the calibration terminal ZQ. The code signals ZQCODE that are obtained by the calibration operation are provided to the input/output circuit 316. The code signals ZQCODE may be used to set impedance of the output driver circuit in the input/output circuit 316, for example.

Figure 4:
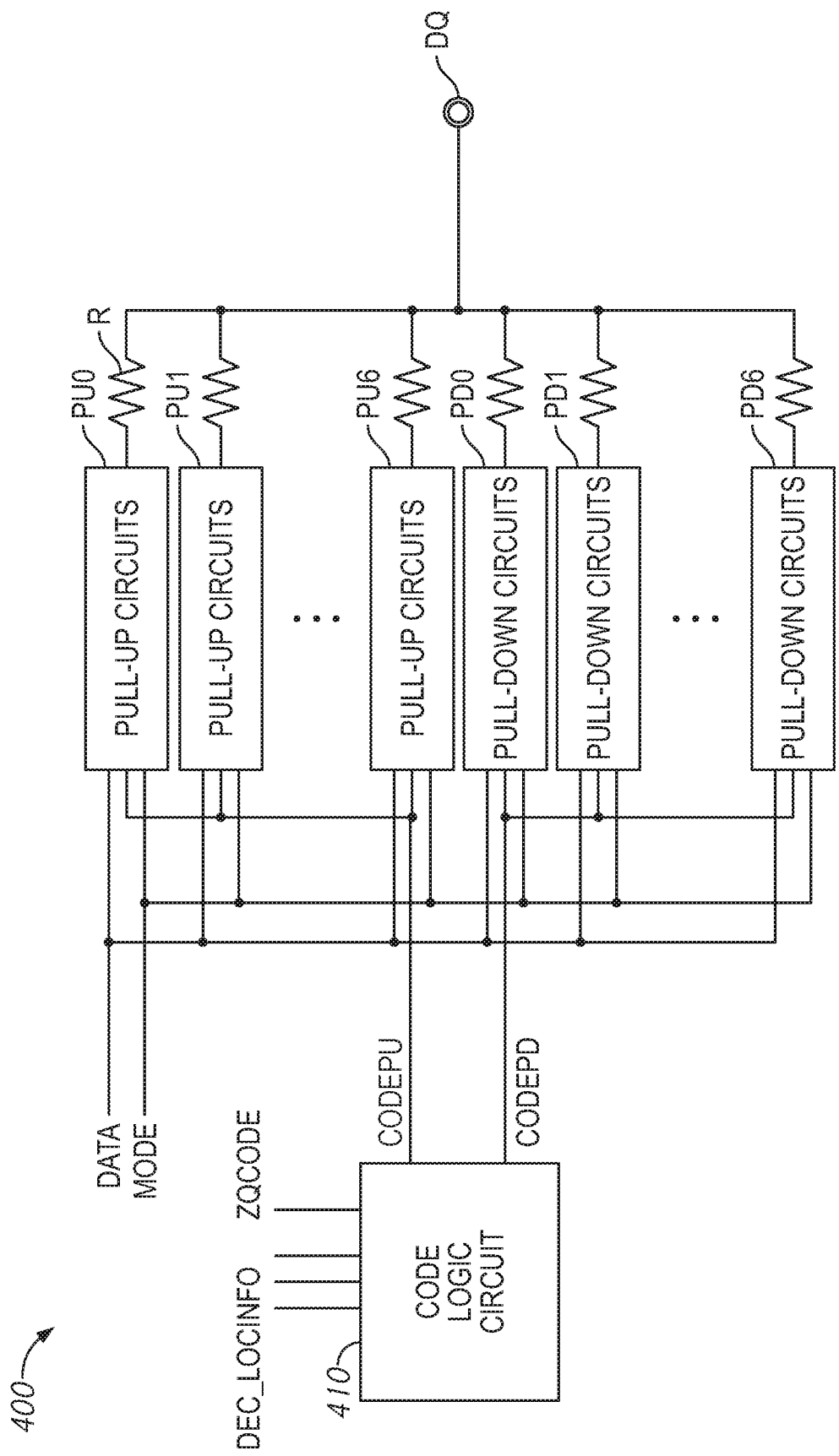
FIG. 4 is a block diagram of an output driver circuit according to an embodiment of the disclosure.

FIG. 4 is a block diagram of an output driver circuit 400 according to an embodiment of the disclosure. The output driver circuit 400 may be included in the input/output circuit 317 of FIG. 3 in some embodiments of the disclosure.

The output driver circuit 400 includes pull-up circuits PU0 to PU6 and pull-down circuits PD0 to PD6 for one data input/output terminal DQ. Output nodes of the pull-up circuits PU0 to PU6 and pull-down circuits PD0 to PD6 are connected in common to a corresponding external data input/output terminal DQ via resistors R. The pull-up circuits PU0 to PU6 may have the same circuit configuration, and are collectively referred to as "pull-up circuits PU". Similarly, the pull-down circuits PD0 to PD6 may have the same circuit configuration, and are collectively referred to as "pull-down circuits PD".

The pull-up circuit PUi (e.g., i=0 to 6) and the pull-down circuit PDi (e.g., i=0 to 6) are paired. The number of the pairs of the circuits to be used is specified by the mode signal MODE output from a mode register, for example, mode register 314 of FIG. 3. Internal data DATA is provided to the pull-up circuits PU0 to PU6 and pull-down circuits PD0 to PD6, for example, from a read/write amplifiers and buffers, such as read/write amplifiers and buffers 315 of FIG. 3. If the internal data DATA indicates a high level, one or more pull-up circuits specified by the mode signal MODE among the pull-up circuits PU0 to PU6 will be activated. As a result, the data input/output terminal DQ is driven to a high level. When the internal data DATA indicates a low level, one or more pull-down circuits specified by the mode signal MODE among the pull-down circuits PD0 to PD6 will be activated. As a result, the data input/output terminal DQ is driven to a low level.

The impedance of each of the activated pull-up circuits PU0 to PU6 is specified by a code signal CODEPU. Similarly, the impedance of each of the activated pull-down circuits PD0 to PD6 is specified by a code signal CODEPD. The impedance of the pull-up and pull-down circuits may set a drive strength of the output driver circuit.

A code logic circuit 410 provides the code signals CODEPU and CODEPD to the pull-up circuits PU0 to PU6 and pull-down circuits PD0 to PD6, respectively. The code logic circuit 410 is provided decoded location information signals DEC_LOCINFO. The decoded location information signals DEC_LOCINFO may be provided by a location decoder circuit, for example, location decoder circuit 337 of FIG. 3. As previously described, the decoded location information signals DEC_LOCINFO indicate location of the semiconductor device. In some embodiments of the disclosure, the decoded location information signals DEC_LOCINFO may be decoded from location information represented by a memory slot address. The memory slot address may be, for example, for a memory module including a semiconductor device that includes the output driver circuit 400. The code logic circuit 410 may also be provided code signals ZQCODE. The code signals ZQCODE may be provided by a calibration circuit, such as calibration circuit 333 of FIG. 3, and may be used by the code logic circuit 410 to provide the code signals CODEPU and CODEPD. In some embodiments of the disclosure, DEC_LOCINFO refers to location information (e.g., embodiments of the disclosure where the location decoder circuit is omitted).

The code logic circuit 410 provides code signals CODEPU and CODEPD based on the decoded location information DEC_LOCINFO. The code signals CODEPU and CODEPD may adjust the impedances of the pull-up circuits PU0 to PU6 and pull-down circuits PD0 to PD6 higher and/or lower based on the decoded location information DEC_LOCINFO. As a result, the impedance of the code logic circuit 410 may be set in consideration of the location of the semiconductor device. Setting the impedance in consideration of the location may improve signal timing and integrity, for example, of data provided by the memory module.

In some embodiments of the disclosure, in providing the code signals CODEPU and CODEPD, the code logic circuit 410 may adjust base code signals based on the decoded location information DEC_LOCINFO to provide the code signals CODEPU to increase or decrease the impedance of the PU circuits relative to the impedance that would be set by the (unadjusted) base code signals in consideration of a location of a memory module (e.g., memory slot location). Likewise, the code logic circuit 410 may also adjust base code signals based on the decoded location information DEC_LOCINFO to provide the code signals CODEPD to increase or decrease the impedance of the PD circuits relative to the impedance that would be set by the (unadjusted) base code signals in consideration of the location of the memory module (e.g., memory slot location).

Figure 5:
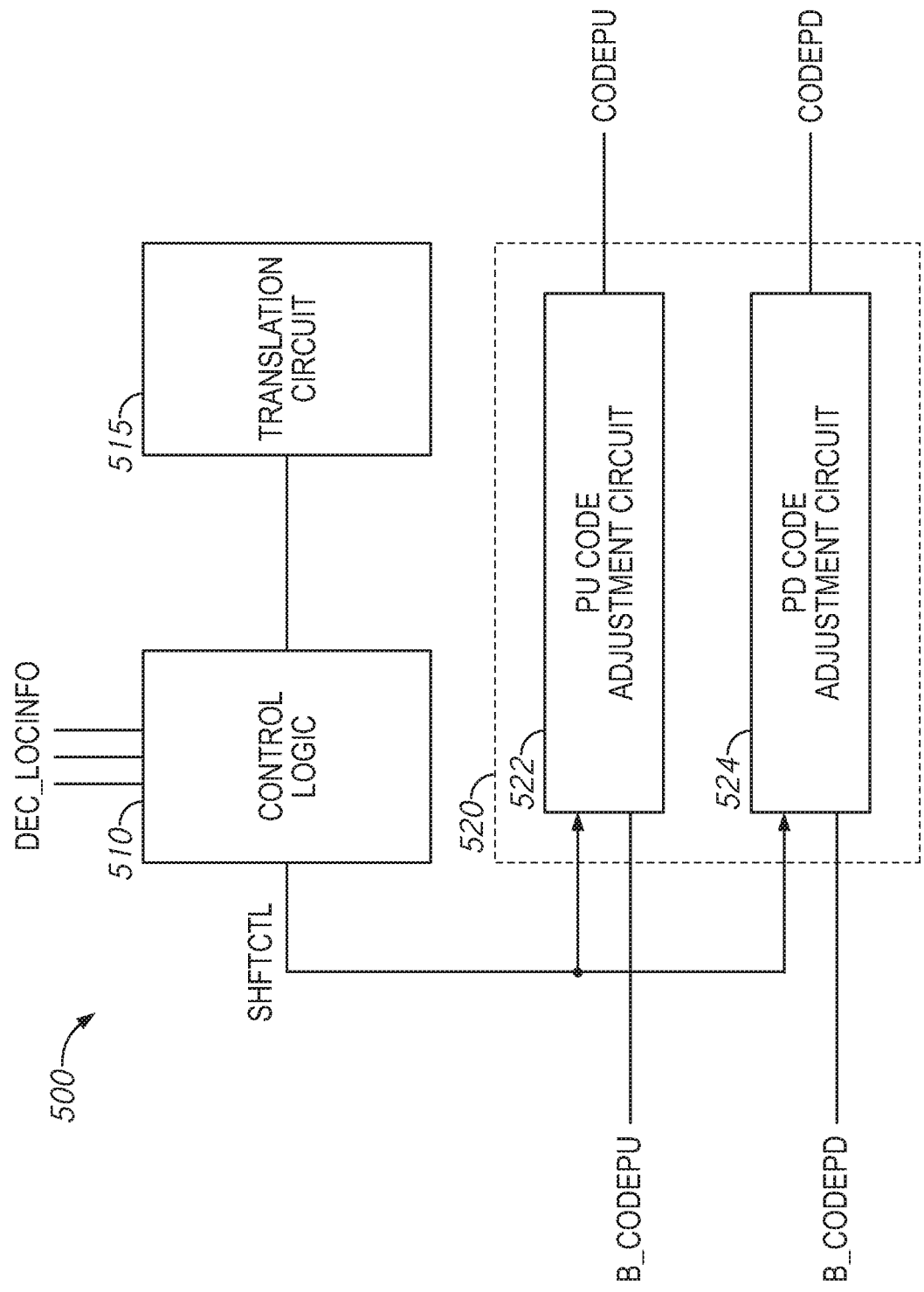
FIG. 5 is a block diagram of an impedance code logic circuit according to an embodiment of the disclosure.

FIG. 5 is a block diagram of an impedance code logic circuit 500 according to an embodiment of the disclosure. The code logic circuit 500 may be included in the code logic circuit 410 of FIG. 4 in some embodiments of the disclosure.

The code logic circuit 500 includes control logic 510 that receives decoded location information DEC_LOCINFO and provides control signals SHFTCTL. The code logic circuit 500 further includes a translation circuit 515, which is accessed by the control logic 510 to provide the control signals SHFTCTL. The control signals SHFTCTL are based on the decoded location information DEC_LOCINFO. For example, the control logic 510 accesses the translation circuit 515 based on the decoded location information DEC_LOCINFO to obtain information corresponding to the decoded location information DEC_LOCINFO, which is then used by the control logic 510 to provide the control signals SHFTCTL. In some embodiments of the disclosure, DEC_LOCINFO refers to location information (e.g., embodiments of the disclosure where the location decoder circuit is omitted).

In some embodiments of the disclosure, the translation circuit 515 includes a lookup table (LUT) having values for providing the control signals SHFTCTL that are indexed according to corresponding decoded location information DEC_LOCINFO. For example, the LUT may include a first value for a first decoded location information and a second value for a second decoded location information. When the decoded location information DEC_LOCINFO corresponds to a first decoded slot address, the control logic 510 uses the first value to provide the control signals SHFTCTL. In contrast, when the decoded location information DEC_LOCINFO corresponds to a second decoded slot address, the control logic 510 uses the second value to provide the control signals SHFTCTL. Thus, the value obtained from the of the translation circuit 515 is used by the control logic 510 to provide the control signals SHFTCTL.

In some embodiments of the disclosure, the translation circuit 515 includes a hardware LUT including logic circuits. In some embodiments of the disclosure, the translation circuit 515 includes memory and/or storage to store values that are accessed by the control logic 510. In some embodiments of the disclosure, the translation circuit 515 may include logic circuits that performs logic operations based on information from the control logic 510, for example, information representing the decoded location information DEC_LOCINFO, to provide values for the control signals SHFTCTL.

The control signals SHFTCTL are provided to code adjustment circuit 520 also included in the code logic circuit 500. The code adjustment circuit 520 includes PU code adjustment circuit 522 and PD code adjustment circuit 524. The PU code adjustment circuit 522 is provided base code signals B_CODEPU and provides code signals CODEPU, and the PD code adjustment circuit 524 is provided base code signals B_CODEPD and provides code signals CODEPD. The code signals B_CODEPU and B_CODEPD may be provided by a calibration circuit, for example, calibration circuit 337 of FIG. 3. For example, the code signals B_CODEPU and B_CODEPD may be included in the code signals ZQCODE provided by the calibration circuit 337 of FIG. 3 in such embodiments of the disclosure.

The PU code adjustment circuit 522 adjusts the code signals B_CODEPU based on the control signals SHFTCTL to provide the code signals CODEPU. The PD code adjustment circuit 524 adjusts the code signals B_CODEPD based on the control signals SHFTCTL to provide the code signals CODEPD. The code signals CODEPU and CODEPD are used to set an impedance of an output driver circuit.

In some embodiments of the disclosure, the PU code adjustment circuit 522 includes a shift circuit that changes a value represented by the code signals B_CODEPU to provide the code signals CODEPU. Similarly, the PD code adjustment circuit 524 includes a shift circuit that changes a value represented by the code signals B_CODEPD to provide the code signals CODEPU. The shift circuits may shift the respective value of the code signals B_CODEPU and B_CODEPD (e.g., increase or decrease the respective value, shift bits, etc.) by amounts represented by the control signals SHFTCTL. As previously described, the control signals SHFTCTL are based on the decoded location information DEC_LOCINFO. As a result, the change in the code signals to the adjusted code signals may be considered respective offsets that are based on the decoded location information DEC_LOCINFO.

The code signals CODEPU and CODEPD may be provided to pull-up circuits and pull-down circuits of an output driver circuit to set output driver circuit impedance, as previously described. In such embodiments of the disclosure, the code signals CODEPU and CODEPD provided by the code logic circuit 500 set an impedance of an output driver circuit based on the location, for example, of a memory device that includes the code logic circuit 500 (e.g., location of a memory module including memory devices that include the code logic circuit 500, as indicated by slot address). Thus, the output driver circuit impedance for a memory device may be tailored based on the location. The code signals CODEPU and CODEPD set the impedances of pull-up circuits and pull-down circuits including offsets relative to impedances that would be set by the (unadjusted) code signals B_CODEPU and B_CODEPD.

For example, in some embodiments of the disclosure, for decoded location information DEC_LOCINFO that indicates a location relatively near a memory controller, the control logic 510 provides the control signals SHFTCTL to control the PU code adjustment circuit 522 and the PD code adjustment circuit 524 to provide the code signals CODEPU and CODEPD, respectively, that provides an offset that increases an output driver circuit impedance relative to a nominal output driver circuit impedance that would have been set by the code signals B_CODEPU and B_CODEPD. Conversely, for decoded location information DEC_LOCINFO that indicates a location relatively far from the memory controller, the control logic 510 provides the control signals SHFTCTL to control the PU code adjustment circuit 522 and the PD code adjustment circuit 524 to provide the code signals CODEPU and CODEPD, respectively, that provides an offset that decreases an output driver circuit impedance relative to the nominal output driver circuit impedance that would have been set by the code signals B_CODEPU and B_CODEPD. A relatively higher output driver circuit impedance results in a relatively lower drive strength, and may consume less power compared to a higher drive strength. A relatively lower output driver circuit impedance results in a relatively higher drive strength, and provide greater signal drivability, for example, to mitigate higher signal line impedance.

In some embodiments of the disclosure, the output driver circuit impedance is reduced by the offset from a nominal output driver circuit impedance, with the nominal output driver circuit impedance corresponding to a location farthest away (e.g., greatest distance and/or greatest line impedance). In some embodiments of the disclosure, the output driver circuit impedance is increased by the offset from a nominal output driver circuit impedance, with the nominal output driver circuit impedance corresponding to a closest location (e.g., shortest distance and/or lowest line impedance). More generally, it may be desirable to have output driver circuit impedance relatively higher for memory located near the memory controller compared to memory located farther away. Described another way, it may be desirable to have output driver circuit impedance relatively lower for memory located away from the memory controller compared to memory located nearer to the memory controller. The code signals CODEPU and CODEPD provided by the code adjustment circuit 520 may provide the offset to output driver circuit impedance based on location accordingly. In this manner, the output driver circuit impedance for each of the memory devices may be tailored based on the location information.

Figure 6:
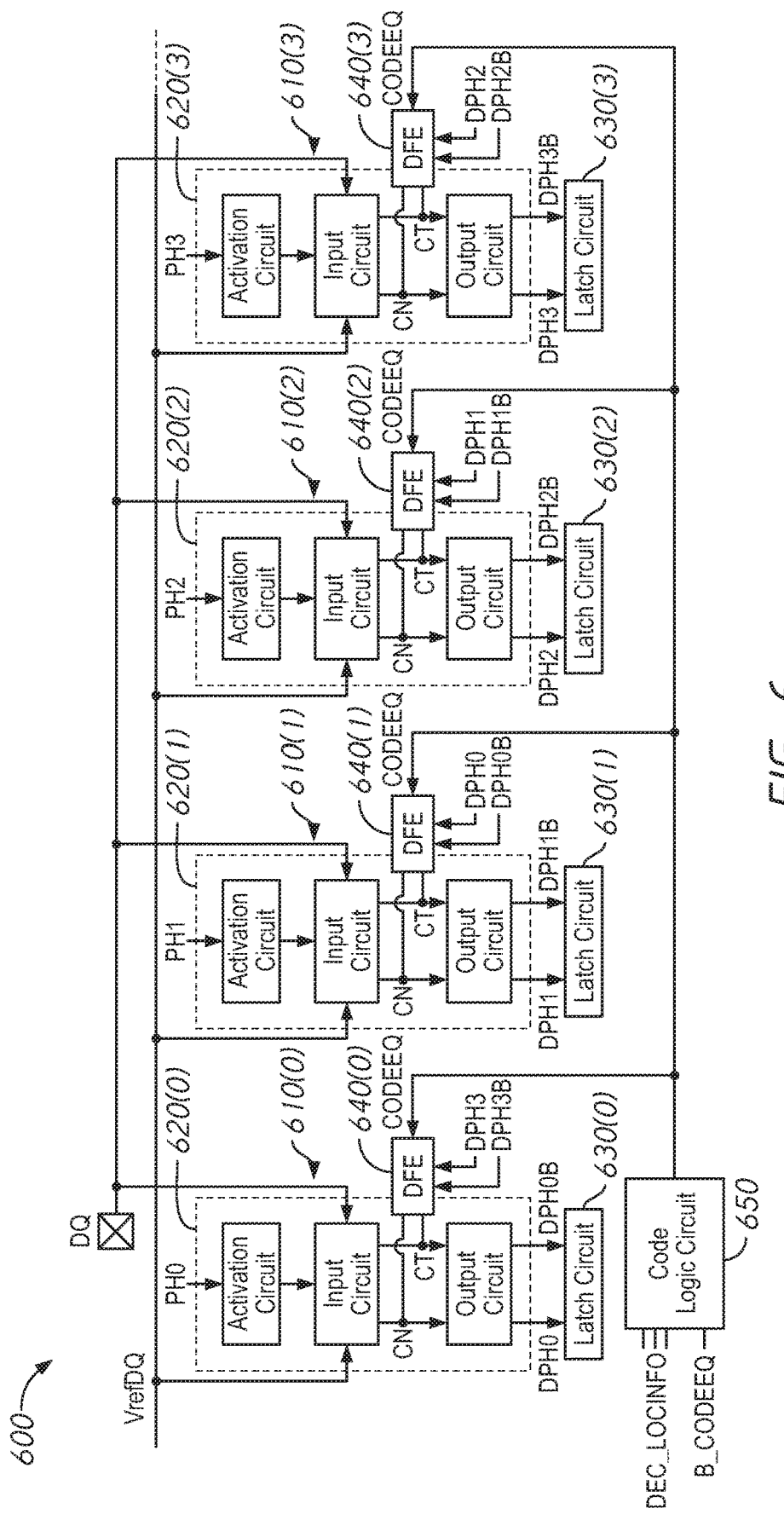
FIG. 6 is a block diagram of an input receiver circuit according to an embodiment of the disclosure.

FIG. 6 is a block diagram of an input receiver circuit 600 according to an embodiment of the disclosure. The input receiver circuit 600 may be included in the input/output circuit 317 of FIG. 3 in some embodiments of the disclosure.

The input receiver circuit 600 receives data serially provided to an external data terminal DQ and latches the data bit-by-bit over one or more clock cycles of multiphase clock signals PH0-PH3. The input receiver circuit 600 includes input receiver circuits 610(0)-610(3) that are coupled to the external data terminal DQ and coupled to a reference voltage supply line on which a data reference voltage VrefDQ is provided. In some embodiments of the disclosure, each external data terminal DQn of a semiconductor device (e.g., semiconductor device 300 of FIG. 3) may have a corresponding input receiver circuit, such as input receiver circuit 600.

Each of the input receiver circuit 610(0)-610(3) is provided a respective one of the multiphase dock signals. For example, the input receiver circuit 610(0) is provided dock PH0, the input receiver circuit 610(1) is provided clock PH1, the input receiver circuit 610(2) is provided clock PH2, and the input receiver circuit receiver circuit 610(3) is provided clock PH3. Each of the multiphase clock signals PH0-PH3 may have a different phase from one another. For example, in some embodiments of the disclosure, the multiphase clock signals PH0-PH3 have a 90 degree phase relative to one another (e.g., "quadrature" clock signals). The PH0 clock may have a 0 degree phase, the PH1 clock may have a 90 degree phase, the PH2 clock may have a 180 degree phase, and the PH3 clock may have a 270 degree phase. Other embodiments of the disclosure may have multiphase clock signals with other relationships to one another.

The input receiver circuit 610(0) includes a sense circuit 620(0) coupled to the external data terminal DQ and the VrefDQ voltage supply line. The sense circuit 620(0) includes an activation circuit that is provided the respective multiphase clock PH0. When activated by the PH0 clock (e.g., high clock level), an input circuit of the sense circuit 620(0) senses a voltage difference between a voltage at the external data terminal DQ and the VrefDQ voltage of the voltage supply line and provides respective voltages to sense nodes CN and CT based on the voltage difference between the DQ voltage and VrefDQ voltage. For example, the input circuit compares the voltage at the external data terminal DQ with the VrefDQ voltage and provides voltages to the CN and CT nodes based on the comparison. An output circuit of the sense circuit 620(0) provides sense outputs to a latch circuit 630(0) that are based on the voltages of the CN and CT nodes and a reference level (trip point level of input receiver circuit 610) set by a decision feedback equalizer (DFE) circuit 640(0) coupled to the CN and CT nodes. The latch circuit 630(0) latches and provides output data DPH0 and DPH0B having logic levels based on the sense outputs. The output data DPH0 and DPH0B may be complementary. That is, one of the output data. DPH0 and DPH0B may have a first logic level (e.g., "0" logic level) and the other output data will have a second logic level that is the opposite of the first logic level (e.g., "1" logic level), or vice versa.

The DFE circuit 640(n) is provided output data DPH(n−1) and DPH(n−1)B from another one of the input receiver circuits 610 and also provided code signals CODEEQ. A code logic circuit 650 receives decoded location information DEC_LOCINFO and provides the code signals CODEEQ to the DFE circuits 640(n). The DEC_LOCINFO may be provided by a location decoder circuit (e.g., location decoder circuit 337 of FIG. 3). In some embodiments of the disclosure, DEC_LOCINFO refers to location information (e.g., embodiments of the disclosure where the location decoder circuit is omitted).

In FIG. 6, the DFE circuit 640(0) is provided the output data DPH3 and DPH3B from the input receiver circuit 610(3); the DFE circuit 640(1) is provided the output data DPH0 and DPH0B from the input receiver circuit 610(0); the DFE circuit 640(2) is provided the output data DPH1 and DPH1B from the input receiver circuit 610(1); and the DFE circuit 640(3) is provided the DPH2 and DPH2B from the input receiver circuit 610(2). However, in other embodiments of the disclosure, a DEE circuit may be provided the output data from other arrangements of the other input receiver circuits.

The DFE circuit 640(n) may set a reference level for the sense circuit 620(n) based on the output data DPH(n−1) and DPH(n−1)B from the other input receiver circuit 610. For example, the DFE circuit 640(0) may set the reference level by changing (e.g., shifting) the reference level from a first reference level to a second reference level, or vice versa, based on the output data DPH3 and DPH3B from the sense circuit 620(3). The DFE circuit 640(0) may also set the reference level by maintaining the reference level from a previous reference level. The reference level set by the DFE circuit 640(0) may be relative to the reference voltage VrefDQ (e.g., higher than the reference voltage VrefDQ or lower than the reference voltage VrefDQ).

The code signals CODEEQ may set a voltage of the reference level. For example, in some embodiments of the disclosure, the code signals CODEEQ set an amount of offset relative to the reference voltage VrefDQ, where the greater the offset, the higher the high reference level and the lower the low reference level.

In operation, the DFE circuit 640(0) sets a reference level (e.g., a high reference level or a low reference level) based on the output data DPH3 and DPH3B from the sense amplifier 620(3), as previously discussed. For example, when the output data DPH3 is a high logic level (e.g., a high logic level voltage) and the output data DPH3B is a low logic level (e.g., a low logic level voltage), the DFE circuit 640(0) may effectively increase the reference level for the input receiver circuit 610(0) relative to the VrefDQ voltage. In contrast, when the output data DPH3 is a low logic level and the output data DPH3B is a high logic level, the DFE circuit 640(0) may decrease a voltage of the reference level for the input receiver circuit 610(0) relative to the VrefDQ voltage. The DFE circuit 640(0) sets a reference level for the input receiver circuit 610(0) based on the output data DPH3 and DPH3B from the input receiver circuit 610(3). The amount of increase and/or decrease of the reference level may be set by the code signals CODEEQ. The amount of increase and/or decrease may be relative to VrefDQ, as previously described, where the code signals CODEEQ set an amount of offset of the VrefDQ voltage. The reference levels set by the DFE circuits 640 may tune input sensitivity of the sense circuit 620. For example, the reference levels may be set to have less deviation from the VrefDQ voltage for the sense circuit to be relatively more sensitive to receiving high or low logic level signals, and the reference levels may be set to have more deviation from the VrefDQ voltage for the sense circuit to be relatively less sensitive to receiving high or low logic level signals.

An active PH0 clock activates the input circuit of the sense circuit 620(0) to compare a voltage at the external node DQ and the VrefDQ voltage. Based on the comparison (e.g., voltage difference), the input circuit provides voltages to the sense nodes CN and CT. The sense nodes CN and CT each develop a respective voltage that is influenced by the DFE circuit 640(0). The output circuit provides sense outputs to the latch circuit 630(0) based on the voltages at the CN and CT nodes. The latch circuit 630(0) latches and provides output data DPH0 and DPH0B having respective logic levels based on the sense outputs. The latch circuit 630(0) provides output data DPH0 and DPH0B, one having the latched logic level and the other having the complementary logic level. The sense circuit 620(0) becomes inactive with an inactive PH0 clock (e.g., low clock level), and the sense nodes CN and CT may be changed and outputs of the input receiver circuit 610(0) may be changed to respective initial voltages in preparation for a next activation (e.g., the input receiver circuit 610(0) is precharged). The sense circuit 620(0) remains inactive until a next active PH0 clock.

The input receiver circuits 610(1)-610(3) are similar to the input receiver circuit 610(0), and the description for input receiver circuit 610(0) also applies to the input receiver circuits 610(1)-610(3). Operation of the input receiver circuits 610(1)-610(3) is similar to that described for the input receiver circuit 610(0).

As previously described, each of the input receiver circuits 610(0)-610(3) receives a respective clock signal having a different phase from the clock signals provided to the other input receiver circuits 610. The sense circuits 620(0)-620(3) are activated at different phases by the PH0-PH3 clocks as a result.

Figure 7:
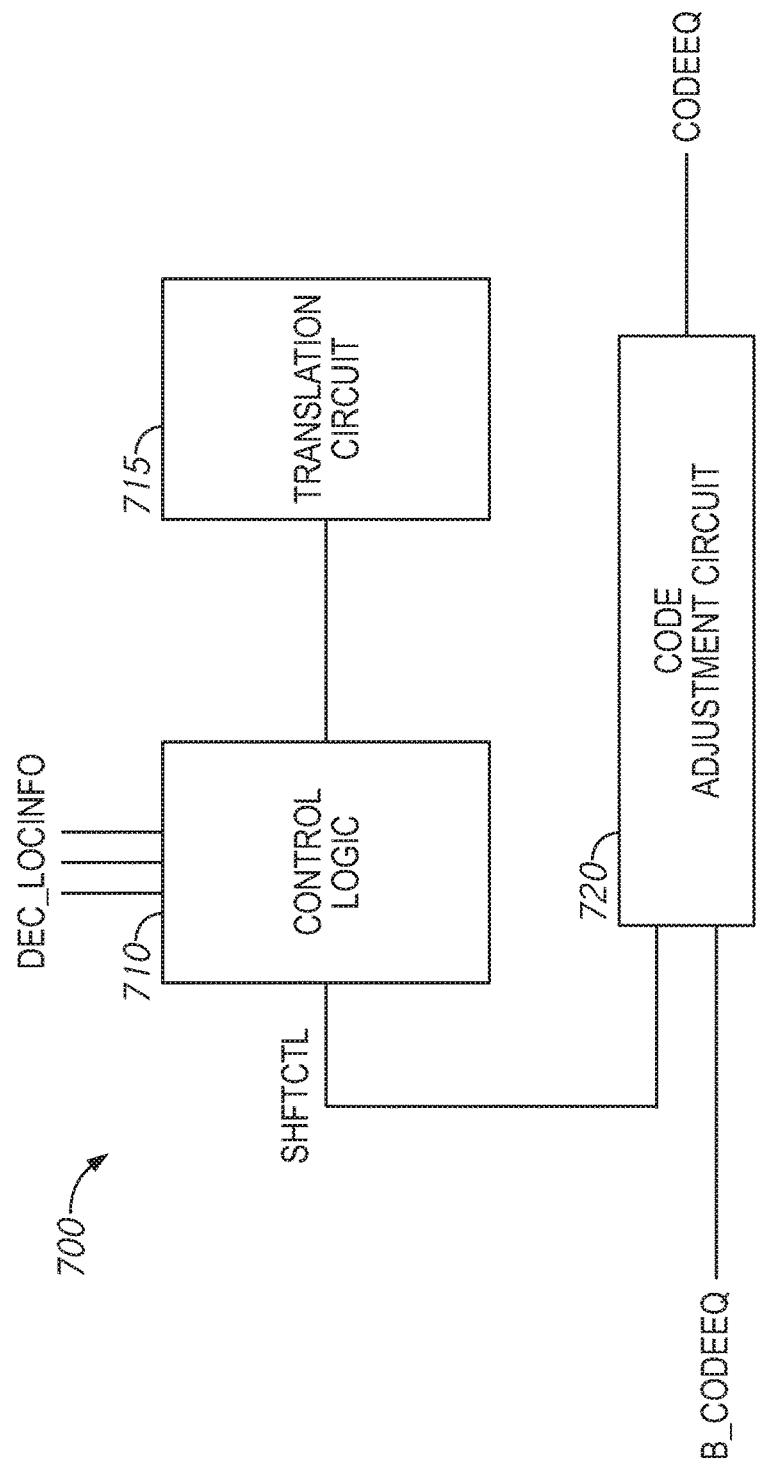
FIG. 7 is a block diagram of an equalization code logic circuit according to an embodiment of the disclosure.

FIG. 7 is a block diagram of an equalization code logic circuit 700 according to an embodiment of the disclosure.

The code logic circuit 700 may be included in the code logic circuit 650 of FIG. 6 in some embodiments of the disclosure.

The code logic circuit 700 includes control logic 710 that receives decoded location information DEC_LOCINFO and provides control signals SHFTCTL. The code logic circuit 700 further includes a translation circuit 715, which is accessed by the control logic 710 to provide the control signals SHFTCTL. The control signals SHFTCTL are based on the decoded location information DEC_LOCINFO. For example, the control logic 710 accesses the translation circuit 715 based on the decoded location information DEC_LOCINFO to obtain information corresponding to the decoded location information DEC_LOCINFO, which is then used by the control logic 710 to provide the control signals SHFTCTL. In some embodiments of the disclosure, DEC_LOCINFO refers to location information (e.g., embodiments of the disclosure where the location decoder circuit is omitted).

In some embodiments of the disclosure, the translation circuit 715 includes a lookup table (LUT) having values for the control signals SHFTCTL that are indexed according to corresponding decoded location information DEC_LOCINFO. For example, the LUT may include a first value for a first decoded location information and a second value for a second location information. When the decoded location information DEC_LOCINFO corresponds to a first decoded slot address, the control logic 710 uses the first value to provide the control signals SHFTCTL. In contrast, when the decoded location information DEC_LOCINFO corresponds to a second decoded slot address, the control logic 710 uses the second value to provide the control signals SHFTCTL. Thus, the value obtained from the of the translation circuit 715 is used by the control logic 710 to provide the control signals SHFTCTL.

In some embodiments of the disclosure, the translation circuit 715 includes a hardware LUT including logic circuits. In some embodiments of the disclosure, the translation circuit 715 includes memory and/or storage to store values that are accessed by the control logic 710. In some embodiments of the disclosure, the translation circuit 715 may include logic circuits that performs logic operations based on information from the control logic 710, for example, information representing the decoded location information DEC_LOCINFO, to provide values for the control signals SHFTCTL.

The control signals SHFTCTL are provided to code adjustment circuit 720 also included in the code logic circuit 700. The code adjustment circuit 720 is provided base code signals B_CODEEQ and provides code signals CODEEQ. The code signals B_CODEEQ may be provided by a command decoder circuit, for example, command decoder circuit 314 of FIG. 3. The code adjustment circuit 720 adjusts the code signals B_CODEEQ based on the control signals SHFTCTL to provide the code signals CODEEQ. The code signals CODEEQ may be used to set a voltage of a reference level (e.g., an offset relative to a reference voltage) of an equalization circuit, for example, a DFE circuit.

In some embodiments of the disclosure, the code adjustment circuit 720 includes a shift circuit that changes a value represented by the code signals B_CODEEQ based on the control signals SHFTCTL to provide the code signals CODEEQ. The shift circuits may shift the respective value of the code signals B_CODEEQ (e.g., increase or decrease the value, shift bits, etc.) by amounts represented by the control signals SHFTCTL. As previously described, the control signals SHFTCTL are based on the decoded location information DEC_LOCINFO. As a result, the change in the code signals B_CODEEQ to the adjusted code signals CODEEQ may be considered respective offsets that are based on the decoded location information DEC_LOCINFO.

The code signals B_CODEEQ may be provided to an equalization circuit of an input receiver circuit to set a reference level for a sense circuit of the input receiver circuit, in some embodiments. In such embodiments of the disclosure, the code signals CODEEQ set a reference level based on the location, for example, of a memory device that includes the code logic circuit 700 (e.g., location of a memory module including memory devices that include the code logic circuit 700). Thus, the sense circuit reference level for a memory device may be tailored based on the location. The code signals CODEEQ set the reference levels for sense circuits of an input receiver circuit including offsets relative to nominal reference levels that would be set by the (unadjusted) code signals B_CODEEQ.

For example, in some embodiments of the disclosure, for decoded location information DEC_LOCINFO that indicates a location relatively near a memory controller, the control logic 710 provides the control signals SHFTCTL to control the code adjustment circuit 720 to provide the code signals CODEEQ that provides an offset that increases a sense circuit reference level relative to the sense circuit reference level that would have been set by the code signals B_CODEEQ. Conversely, for decoded location information DEC_LOCINFO that indicates a location relatively far from the memory controller, the control logic 710 provides the control signals SHFTCTL to control the code adjustment circuit 720 to provide the code signals CODEEQ that provides an offset that decreases a sense circuit reference level relative to the sense circuit reference level that would have been set by the code signals B_CODEEQ.

In some embodiments of the disclosure, the sense circuit reference level is reduced by the offset from a nominal sense circuit reference level, with the nominal sense circuit reference level corresponding to a location farthest away (e.g., greatest distance and/or greatest line impedance). In some embodiments of the disclosure, the sense circuit reference level is increased by the offset from a nominal sense circuit reference level, with the nominal sense circuit reference level corresponding to a closest location (e.g., shortest distance and/or lowest line impedance). More generally, it may be desirable to have the sense circuit reference level relatively higher for memory located near the memory controller compared to memory located farther away. Described another way, it may be desirable to have the sense circuit reference level relatively lower for memory located away from the memory controller compared to memory located nearer to the memory controller. The code signals CODEEQ provided by the code adjustment circuit 720 may provide the offset to the sense circuit reference level based on location accordingly. In this manner, the sense circuit reference level for each of the memory devices may be tailored based on the location information.

The code logic circuit 700 was described as providing code signals to an equalization circuit including a decision feedback equalizer. In some embodiments of the disclosure, the equalization circuit may include a continuous time linear equalizer (CTLE). Such embodiments of the disclosure include a code logic circuit that provides adjusted code signals to the CTLE to provide an offset for the CTLE levels based on decoded location information. The code logic circuit may include circuits and may operate in a manner similar to that previously described with reference to FIG. 7.

More generally, the disclosure is not limited to specific examples of equalization circuits and code logic circuits.

Figure 8:
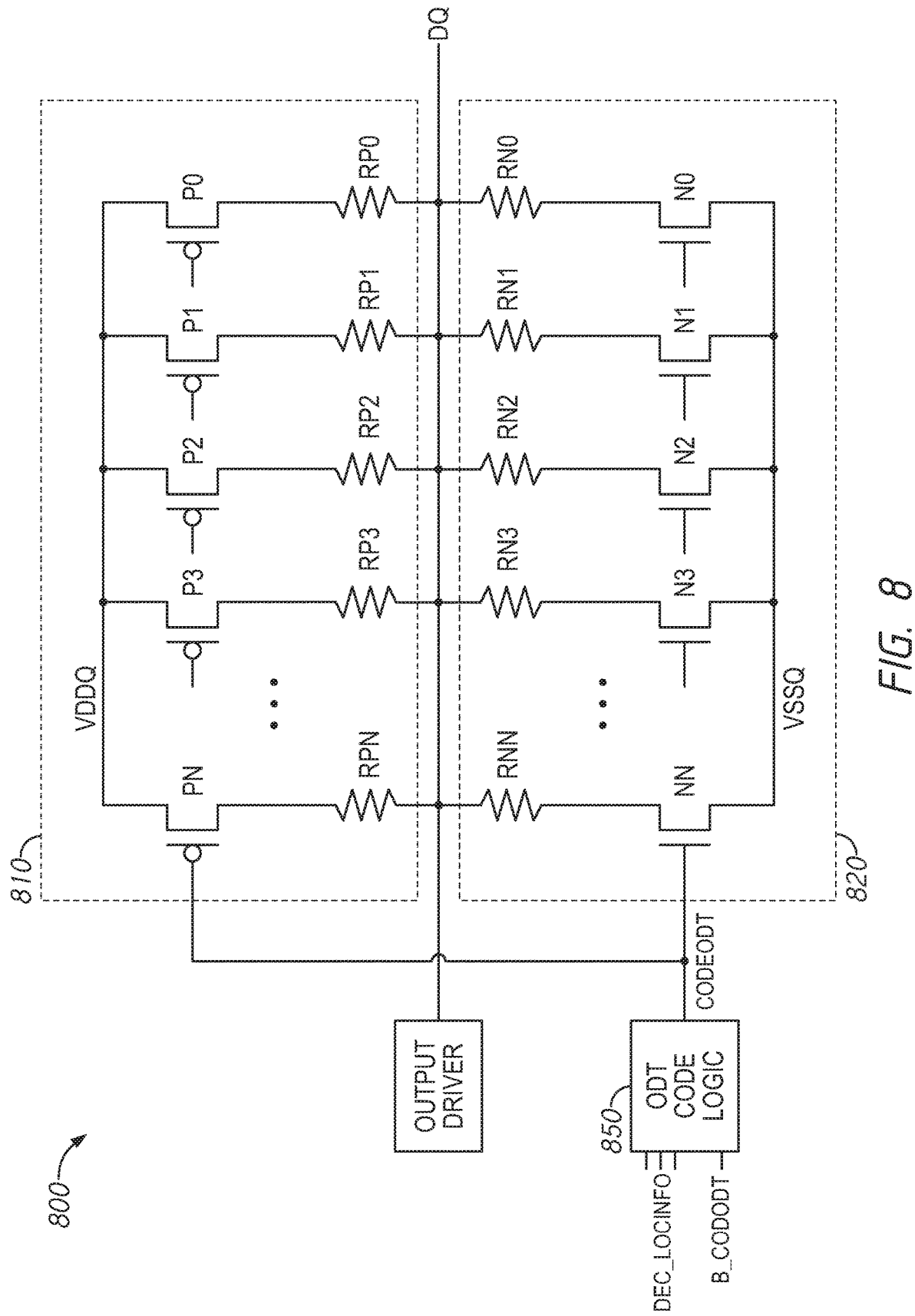
FIG. 8 is a schematic diagram of a termination circuit according to an embodiment of the disclosure.

FIG. 8 is a schematic diagram of a termination circuit 800 according to an embodiment of the disclosure. The termination circuit 800 may be included in the input/output circuit 317 of FIG. 3 in some embodiments of the disclosure.

The termination circuit 800 may be coupled to an output of an output driver circuit (e.g., included in the input/output circuit 317 of FIG. 3). The termination circuit 800 may include a pull-up termination circuit 810 and a pull-down termination circuit 820 coupled to the output of the output driver circuit. The pull-up termination circuit 810 includes a plurality of p-channel transistors P0-PN and series-coupled resistances RP0-RPN, which are coupled in parallel between a power supply voltage (e.g., VDDQ) and the output of the output driver circuit. The pull-down termination circuit 820 includes a plurality of n-channel transistors N0-NN and series-coupled resistances RN0-RNN, which are coupled in parallel between a reference voltage (e.g., VSSQ) and the output of the output driver circuit. The output of the output driver circuit may be coupled to an external terminal (e.g., external data terminal) and provide data DQ to the external terminal, for example, for a read operation.

In some embodiments of the disclosure, the code signals CODEODT may include a respective signal for each of the transistors P0-PN of the pull-up termination circuit 810 and further include a respective signal for each of the transistors N0-NN of the pull-down termination circuit 820. A transistor may be activated when the respective code signal is active, thereby coupling the respective resistance between the power supply or voltage reference and the output of the output driver. The termination impedance results from the resistances that are coupled between the power supply or voltage reference and the output of the output driver.

A code logic circuit receives code signals B_CODEODT and decoded location information DEC_LOCINFO, and provides code signals CODEODT to the termination circuit 800. The CODEODT signals may be used to set a termination impedance for the external terminal coupled to the output driver circuit. The CODEODT signals may be based on the B_CODEODT signals and the decoded location information DEC_LOCINFO. For example, the CODEODT signals may set termination impedance having an offset relative to a nominal termination impedance that would have been set according to the B_CODEODT signals, with the offset based on the decoded location information DEC_LOCINFO. In some embodiments of the disclosure, DEC_LOCINFO refers to location information (e.g., embodiments of the disclosure where the location decoder circuit is omitted).

Figure 9:
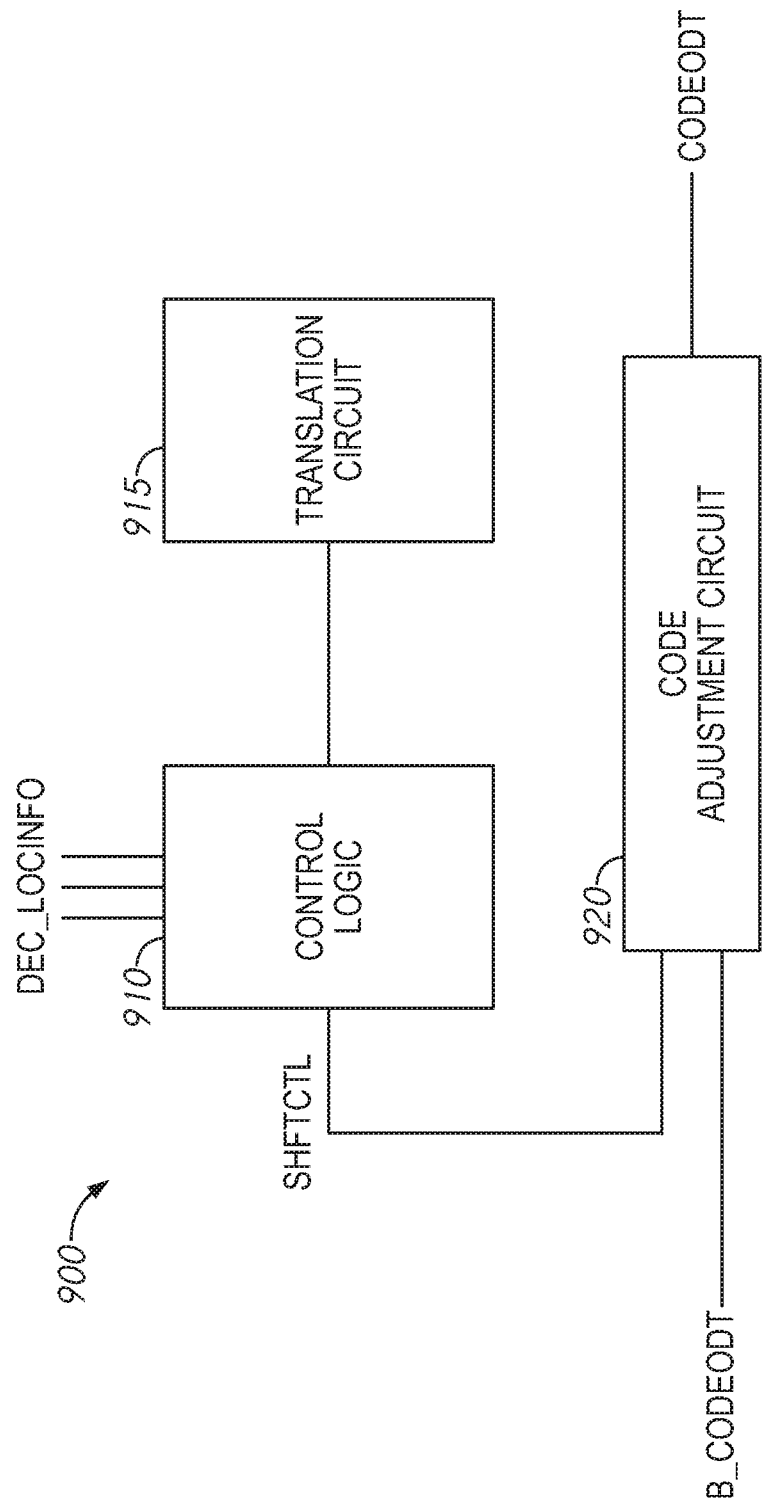
FIG. 9 is a block diagram of a termination code logic circuit according to an embodiment of the disclosure.

FIG. 9 is a block diagram of a termination code logic circuit 900 according to an embodiment of the disclosure. The code logic circuit 900 may be included in the code logic circuit 850 of FIG. 6 in some embodiments of the disclosure.

The code logic circuit 900 includes control logic 910 that receives decoded location information DEC_LOCINFO and provides control signals SHFTCTL. The code logic circuit 900 further includes a translation circuit 915, which is accessed by the control logic 910 to provide the control signals SHFTCTL. The control signals SHFTCTL are based on the decoded location information DEC_LOCINFO. For example, the control logic 910 accesses the translation circuit 915 based on the decoded location information DEC_LOCINFO to obtain information corresponding to the decoded location information DEC_LOCINFO, which is then used by the control logic 910 to provide the control signals SHFTCTL. In some embodiments of the disclosure, DEC_LOCINFO refers to location information (e.g., embodiments of the disclosure where the location decoder circuit is omitted).

In some embodiments of the disclosure, the translation circuit 915 includes a lookup table (LUT) having values for the control signals SHFTCTL that are indexed according to corresponding decoded location information DEC_LOCINFO. For example, the LUT may include a first value for a first decoded location information and a second value for a second location information. When the decoded location information DEC_LOCINFO corresponds to a first decoded slot address, the control logic 910 uses the first value to provide the control signals SHFTCTL. In contrast, when the decoded location information DEC_LOCINFO corresponds to a second decoded slot address, the control logic 910 uses the second value to provide the control signals SHFTCTL. Thus, the value obtained from the LUT of the translation circuit 915 is used by the control logic 910 to provide the control signals SHFTCTL.

In some embodiments of the disclosure, the translation circuit 915 includes a hardware LUT including logic circuits. In some embodiments of the disclosure, the translation circuit 915 includes memory and/or storage to store values that are accessed by the control logic 910. In some embodiments of the disclosure, the translation circuit 915 may include logic circuits that performs logic operations based on information from the control logic 910, for example, information representing the decoded location information DEC_LOCINFO, to provide values for the control signals SHFTCTL.

The control signals SHFTCTL are provided to code adjustment circuit 920 also included in the code logic circuit 900. The code adjustment circuit 920 is provided base code signals B_CODEODT and provides code signals CODEODT. The code signals B_CODEODT may be provided by a command decoder circuit, for example, command decoder circuit 314 of FIG. 3. The code adjustment circuit 920 adjusts the code signals B_CODEODT based on the control signals SHFTCTL to provide the code signals CODEODT. The code signals CODEODT may be used to set a termination impedance of a termination circuit (e.g., termination circuit 800 of FIG. 8).

In some embodiments of the disclosure, the code adjustment circuit 920 includes a shift circuit that changes a value represented by the code signals CODEODT based on the control signals SHFTCTL to provide the code signals CODEODT. The shift circuits may shift the respective value of the code signals B_CODEODT (e.g., increase or decrease the value, shift bits, etc.) by amounts represented by the control signals SHFTCTL. As previously described, the control signals SHFTCTL are based on the decoded location information DEC_LOCINFO. As a result, the change in the code signals B_CODEODT to the adjusted code signals CODEODT may be considered respective offsets that are based on the decoded location information DEC_LOCINFO.

The code signals B_CODEODT may be provided to an equalization circuit of an input receiver circuit to set a reference level for a sense circuit of the input receiver circuit, in some embodiments. In such embodiments of the disclosure, the code signals CODEODT set termination impedance based on the location, for example, of a memory device that includes the code logic circuit 900 (e.g., location of a memory module including memory devices that include the code logic circuit 900). Thus, the termination impedance for a memory device may be tailored based on the location. The code signals CODEODT set the termination impedance for a termination circuit including offsets relative to a nominal termination impedance that would be set by the (unadjusted) code signals B_CODEODT.

For example, in some embodiments of the disclosure, for decoded location information DEC_LOCINFO that indicates a location relatively near a memory controller, the control logic 910 provides the control signals SHFTCTL to control the code adjustment circuit 920 to provide the code signals CODEODT that provides an offset that increases a termination impedance relative to the termination impedance that would have been set by the code signals B_CODEODT. Conversely, for decoded location information DEC_LOCINFO that indicates a location relatively far from the memory controller, the control logic 910 provides the control signals SHFTCTL to control the code adjustment circuit 920 to provide the code signals CODEODT that provides an offset that decreases a termination impedance relative to the termination impedance that would have been set by the code signals B_CODEODT.

In some embodiments of the disclosure, the termination impedance is reduced by the offset from a nominal termination impedance, with the nominal termination impedance corresponding to a location farthest away (e.g., greatest distance and/or greatest line impedance). In some embodiments of the disclosure, the termination impedance is increased by the offset from a nominal termination impedance, with the nominal termination impedance corresponding to a closest location (e.g., shortest distance and/or lowest line impedance). More generally, it may be desirable to have the termination impedance relatively higher for memory located near the memory controller compared to memory located farther away. Described another way, it may be desirable to have the termination impedance relatively lower for memory located away from the memory controller compared to memory located nearer to the memory controller. The code signals CODEODT provided by the code adjustment circuit 920 may provide the offset to the termination impedance based on location accordingly. In this manner, the termination impedance for each of the memory devices may be tailored based on the location information.

In some embodiments of the disclosure, operational parameters of a memory device may be set based on location of the memory device within a memory sub-system, such as a memory module, or other sub-system including multiple memory devices. For example, in some embodiments of the disclosure, the memory module may include regions and operational parameters of a memory device may be set based on the region in which the memory device is located. More generally, a memory sub-system may include regions and operational parameters of a memory device may be set based on the region of the memory sub-system in which the memory device is located.

Figure 10A:
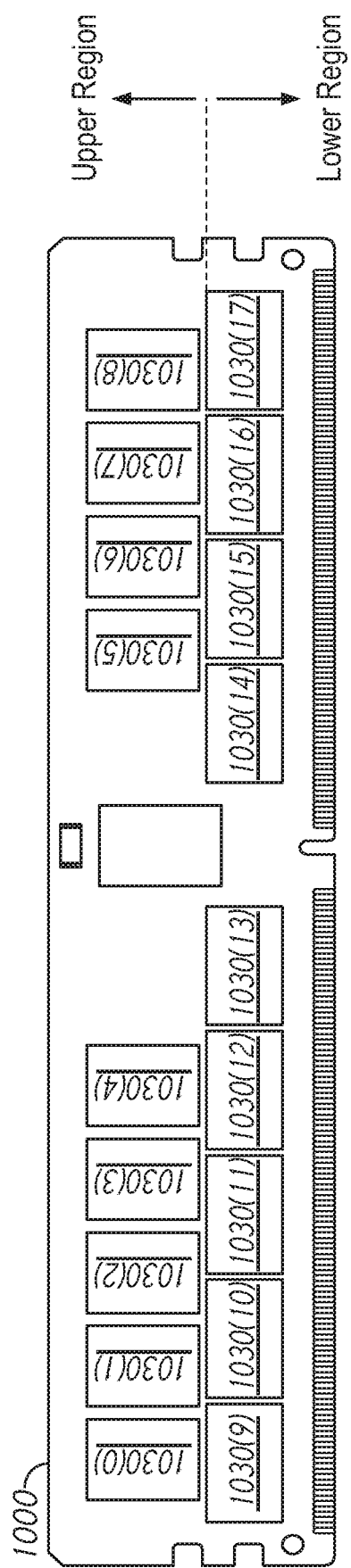
FIGS. 10A and 10B are diagrams of a memory module according to an embodiment of the disclosure.
Figure 10B:
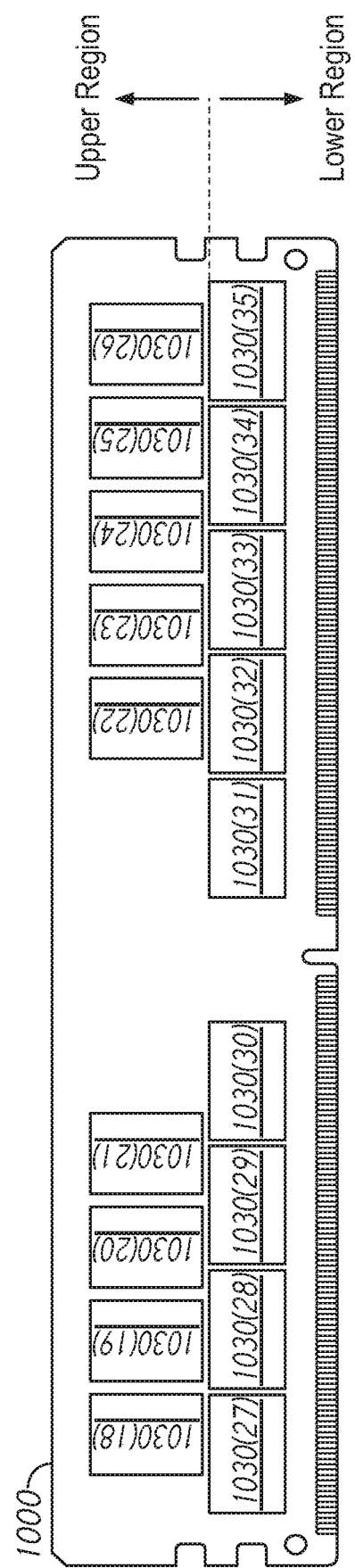

FIGS. 10A and 10B are diagrams of a memory module 1000 according to an embodiment of the disclosure. FIG. 10A illustrates a first side of the memory module 1000 and FIG. 10B illustrates a second side of the memory module 1000. In some embodiments of the disclosure, the memory module 1000 may be included in the memory 110 of FIG. 1.

The memory module 1000 includes memory devices 1030(0)-1030(35) attached to a module substrate that includes signals lines, edge connectors, and conductive pads. The memory devices 1030(0)-1030(17) are included on the first side of the memory module 1000 (FIG. 10A) and the memory devices 1030(18)-1030(35) on the second side (FIG. 10B). The memory module 1000 may also include a configuration circuit 1035 on the first side. The memory devices 1030(0)-1030(35) may be attached, for example, to the conductive pads by solder attachment, thereby coupling external terminals of the memory devices to the signal lines of the module substrate through the conductive pads. Signals for controlling and accessing the memory devices 1030(0)-1030(35) may be provided through conductive paths including the edge connectors, signal lines, conductive pads, and external terminals. The signals may be provided, for example, by a memory controller (e.g., memory controller 10).

In an embodiment of the disclosure, each side of the memory module includes two regions: a lower region (closer to the edge connector) and an upper region. The memory devices 1030(0)-1030(35) are included in one of the regions on the first or second side of the memory module 1000. For example, the memory devices 1030(0)-1030(8) are included in the upper region of the first side; the memory devices 1030(9)-1030(17) are included in the lower region of the first side; the memory devices 1030(18)-1030(26) are included in the upper region of the second side; and the memory devices 1030(27)-1030(35) are included in the lower region of the second side.

Due to differences in signal line length relative to the edge connectors, and also more generally, across the memory module 1000, the quality of signals provided to the memory devices included in the upper region is different than the signals provided to the memory devices in the lower region. For example, the rank margining tool (RMT) performance for the memory devices included in the upper region are lower than for the memory devices included in the lower region.

In some embodiments of the disclosure, the operational parameters of the memory devices located in the upper region of the first and second sides may be different than the operational parameters of the memory devices located in the lower region of the first and second sides. The operational parameters of the respective memory devices may be based on the location of the respective memory devices on the memory module 1000 (e.g., located in the upper region or the lower region). The different operational parameters may mitigate performance differences resulting from the location of the respective memory devices.

The memory devices on the memory module 1000 may be provided in some embodiments of the disclosure by the semiconductor device 300 of FIG. 3 and/or include one or more of the circuits previously described with reference to FIGS. 4-9, for example, for setting output driver circuit impedance, reference levels for equalization circuits, and termination impedance. In some embodiments of the disclosure, a location decoder circuit included in a memory device is provided location information through data terminals, for example, unused data terminals. An unused data terminal may be provided when less than all of the data terminals are used for providing and receiving data (e.g., a memory device including 8 data terminals but operated as a ×4 memory device, which provides 4 unused data terminals). In some embodiments of the disclosure, a location decoder circuit included in a memory device is provided location information through an unused terminal, such as a TEN terminal, parity terminal, one of VSS or VDD terminals. An unused terminal is terminal that is not used during operation of the memory device. An unused terminal (other than a data terminal) may be used when all of the data terminals are used during operation of the memory device (e.g., a memory device including 8 data terminals and is operated as a ×8 memory device).

In some embodiments of the disclosure, the location information is provided by hard wired location information to the unused data terminals. For example, in some embodiments of the disclosure, the unused terminals for receiving location information may be respectively coupled to (or provided) a first voltage (e.g., a high logic level voltage) or a second voltage (e.g., a low logic level voltage) to provide a combination of bits representing the location information. The first and second voltages may be provided through power nodes included in the memory module 1000.

In some embodiments of the disclosure, the location information may be provided to each of the memory devices by a memory controller (e.g., memory controller 10). For example, in embodiments of the disclosure where unused data terminals are provided location information, the memory controller may provide the location information to the unused data terminals. The location decoder circuits of the memory devices receive the location information and set operational parameters accordingly. The location information may be based on an understanding of the location of a memory device on the memory module 1000 (e.g., located in the upper region or in the lower region).

The location information may include one or more signals, each provided to a respective unused terminal. The location decoder circuit receives the location information signals and provides decoded location information signals (e.g., DEC_LOCINFO) as previously described. Code logic circuits may be provided the decoded location information signals and provide code signals that are used to set operational parameters based on the decoded location information signals. As a result, the operational parameters of a memory device may be set based on location information provided to the memory device. In some embodiments of the disclosure, the code signals provided by the code logic circuits have an offset relative to base code signals that are based on the decoded location information signals.

With reference to memory devices included on the memory module 1000, location information may be provided (e.g., by a memory controller) to each memory device corresponding to the region in which the memory device is included. For example, the memory devices 1030(0)-1030 (8) and 1030(18)-1030(26) may be provided location information corresponding to the upper region of the memory module 1000; and the memory devices 1030(9)-1030(17) and 1030(27)-1030(35) may be provided location information corresponding to the lower region of the memory module 1000. In some embodiments of the disclosure, the lower region may correspond to a default location and location information is not needed for the memory devices included in the lower region. In some embodiments of the disclosure, the upper region may correspond to the default location instead.

In an example related to output driver circuit impedance, the decoded location information provided by the decoder circuits of the memory devices included in the upper region of the memory module will cause the respective code circuits to provide code signals to set relatively lower output driver circuit impedance compared to the memory devices included in the lower region of the memory module. In some embodiments of the disclosure, the relatively lower output driver circuit impedance is offset from a nominal output driver circuit impedance as a result of the code signals provided by the code logic circuit based on the decoded location information. The relatively lower output driver circuit impedance provides a relatively higher drive strength. In some embodiments of the disclosure, the decoded location information provided by the decoder circuits of the memory devices included in the lower region of the memory module will cause the respective code circuits to provide code signals to set relatively higher output driver circuit impedance compared to the memory devices included in the upper region of the memory module. In some embodiments of the disclosure, the relatively higher output driver circuit impedance is offset from a nominal output driver circuit impedance as a result of the code signals provided by the code logic circuit based on the decoded location information. The relatively higher output driver circuit impedance provides a relatively lower drive strength, and relatively lower power consumption. In some embodiments of the disclosure, the output driver circuit impedance of the memory devices of the upper and lower regions are set based on the respective location information.

As previously described, memory devices that are located relatively farther away may have relatively lower output driver impedance compared to memory devices that are located relatively closer (e.g., a memory device included in a memory module that is relatively farther away from a memory controller). With regards to the memory devices included in the upper region of the memory module, the memory devices are located relatively farther away from the edge connectors than the memory devices included in the lower region.

With respect to equalization and termination impedance, the settings for these operational parameters will follow the same general rule as for setting equalization and termination impedance as previously described. For example, memory devices included in the upper region of the memory module 1000 are set to have relatively lower reference voltage offset for equalization than for memory devices included in the lower region of the memory module 1000. In some embodiments of the disclosure, the relatively lower reference voltage offset for equalization is offset from a nominal reference voltage offset for equalization as a result of the code signals provided by the code logic circuit based on the decoded location information. The relatively lower reference voltage offset provides greater sensitivity for sense amplifiers circuits of the input/output circuits. In some embodiments of the disclosure, memory devices included in the lower region of the memory module 1000 are set to have relatively higher reference voltage offset for equalization than for memory devices included in the upper region of the memory module 1000. In some embodiments of the disclosure the memory devices of the upper and lower regions have reference voltages set based on the location information.

Memory devices included in the upper region of the memory module 1000 may be set to have relatively lower termination impedance than for memory devices included in the lower region of the memory module 1000. In some embodiments of the disclosure, the relatively lower termination impedance is offset from a nominal termination impedance as a result of the code signals provided by the code logic circuit based on the decoded location information. In some embodiments of the disclosure, memory devices included in the lower region of the memory module 1000 may be set to have relatively higher termination impedance than for memory devices included in the upper region of the memory module 1000. In some embodiments of the disclosure the memory devices of the upper and lower regions have termination impedance set based on the location information.

As described with reference to the memory module 1000, and in light of the description for FIGS. 1-9, operational parameters of a memory device may be set based on location of the memory device in a memory sub-system, for example, a memory module.

The memory module 1000 of FIG. 10 has been described as included two regions: an upper region and a lower region (the lower region closer to the edge connector of the memory module). However, embodiments of the disclosure are not limited to including only upper and lower regions, or including only two regions. A memory sub-system may include greater regions without departing from the scope of the disclosure. For example, in some embodiments of the disclosure, each side of a memory module may include four regions: upper-left regions, upper-right region; lower-left region, and lower-region. It will be appreciated, however, that the greater the number of regions, likely the greater number of signals included in the location information signals. In some embodiments of the disclosure where a memory includes one external terminal for use with location information, the memory subsystem including the memory may include two regions. A first region is represented by a first binary value (e.g., "0") of location information and a second region is represented by a second binary value (e.g., "1") of location information.

Location information more generally represent a characteristic/condition that affects the signal that is provided to and from the memory device and/or operation of the memory device, for example, signal line impedance, ambient temperature, voltage supply voltage and/or current, process, etc. The information provided to a decoder circuit (e.g., location information decoder circuit) is decoded, and decoded information may be provided to a code circuit that provides code signals to set an operational condition of a circuit based on the information. Thus, embodiments of the disclosure are not limited to using location information, but may include using other information indicative of a characteristic/condition that affects signals to and from the memory and/or affects operation of the memory device.

In some embodiments of the disclosure, operational parameters of a memory device may be set based on location information programmed in the memory device, for example, programmed by a memory controller. In some embodiments of the disclosure, the information may be programmed in a mode register, for example, using mode register write (mode register set) commands to registers reserved for the location information. The programmed information may then be used by the memory device to set operational parameters accordingly (e.g., as previously described).

Figure 11:
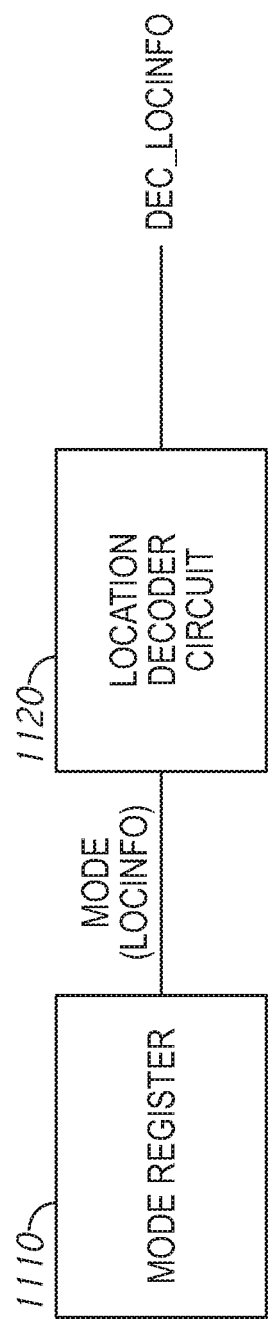
FIG. 11 is a block diagram of mode register and location decoder circuit according to an embodiment of the disclosure.

FIG. 11 is a block diagram of mode register 1110 and location decoder circuit 1120 according to an embodiment of the disclosure. In some embodiments of the disclosure, the mode register is included in the mode register 314 of FIG. 3 and/or the location decoder circuit 1120 is included in the location decoder circuit 337 of FIG. 3.

The mode register 1110 may include registers that are be programmed with location information. The programmed location information may be provided to (e.g., accessed by) the location decoder circuit 1120, which decodes the location information to provide decoded location information DEC_LOCINFO. In some embodiments of the disclosure, the location decoder circuit 1120 is omitted and the location information programmed in the mode register 1110 is provided to a code circuit. In some embodiments, the decoded location information DEC_LOCINFO may refer to the location information (e.g., embodiments of the disclosure where the location decoder circuit is omitted).

The location information may include one or more bits to represent a value. Each of the values may correspond to a location of the memory device. For example, in some embodiments of the disclosure, the values may correspond to a location of a memory module in which the memory device is included. In some embodiments of the disclosure, the values may correspond to a region of a memory subsystem (e.g., memory module) in which the memory device is included.

The location information programmed in the mode register 1110 and/or the decoded location information DEC_LOCINFO may be used by a code logic circuit to provide code signals that are used to set operational parameters based on the decoded location information signals. As a result, the operational parameters of a memory device may be set based on location information provided to the memory device. Previously described embodiments of the disclosure may be used in combination with the embodiments described with reference to FIG. 11 for setting one or more operational parameters of a memory device. In some embodiments of the disclosure, the code signals provided by the code logic circuits have an offset relative to base code signals that are based on the decoded location information signals.

The mode register 1110 may be programmed with location information during power up (e.g., boot up) of a system including the memory devices. In some embodiments of the disclosure, the location information may be included in the memory reference code of a basic input/output system (BIOS) and programmed to the mode register 1110 during power up of the system. The mode register 1110 may alternatively or additionally be programmed with location information by a memory controller (e.g., memory controller 10). For example, the location information may be programmed using a mode register write (mode register set) command issued by the memory controller.

FIG. 12 is a diagram of location information values and corresponding location according to an embodiment of the disclosure. The values may be programmed in a mode register, for example, mode register 314 of FIG. 3, mode register 1110 of FIG. 11, and the like. The locations of FIG. 12 correspond to memory slots in which memory modules may be located. Memory modules located in the memory slots may be coupled to a memory controller (e.g., memory controller 10). In some embodiments of the disclosure, the location information values and corresponding locations may be used with the apparatus of FIG. 2.

FIG. 12 includes location information values (shown in Hex values) corresponding to 12 different locations (C=channel, S=slot): 0H=C0S0, 1H=C0S1, 2H=C1S0, 3H=C1S1, 4H=C2S0, 5H=C2S1, 6H=C3S0, 7H=C3S1, AH=C4S0, BH=C4S1, CH=C5S0, DH=C5S1. In an example, mode registers of memory devices included in a memory module that is located in the memory slot corresponding to channel 4, slot 1 are programmed with location information B (Hex). The location information may be used by the memory devices to set operational parameters accordingly (e.g., output driver circuit impedance, reference level for equalization, termination impedance, etc.).

The embodiment of the disclosure of FIG. 12 is not intended to limit the scope of the disclosure to the specific details previously described, and other embodiments of the disclosure may have greater or fewer location information values and corresponding locations.

Any of the features and details from any of the previously described embodiments of the disclosure may be interchanged and/or combined with features and details of any of the other embodiments of the disclosure. While features and/or details may have been described with reference to an embodiment of the disclosure, those features and/or details are not intended to be limited to the particular embodiment of the disclosure. Thus, embodiments of the disclosure are not limited to the specific combinations of features and/or details previously described for any particular embodiment of the disclosure.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a memory bus including a plurality of signal lines;
   a memory controller coupled to the memory bus and configured to provide control information to the memory bus; and
   a plurality of memory modules coupled to the memory bus and configured to receive the control information from the memory controller, each of the plurality of memory modules including a plurality of memory devices configured to receive location information indicative of a relative location of a respective memory module, each of the plurality of memory devices of a memory module including an input/output circuit configured to operate based on operational parameters and further including a code logic circuit, configured to receive impedance code signals internally, and further configured to set operational parameters for the input/output circuit responsive to the impedance code signals, wherein the operational parameters for the input/output circuit are based at least in part on the location information for the respective memory module,
   wherein the input/output circuit comprises at least one of an impedance calibration circuit, an equalization control circuit or termination impedance circuit.

2. The apparatus of claim 1 wherein the location information comprises memory slot address.

3. The apparatus of claim 2 wherein a memory slot address comprises a hard wired slot address.

4. The apparatus of claim 1 wherein the location information is indicative of a location of a respective memory module relative to the memory controller.

5. The apparatus of claim 1 wherein the plurality of memory devices of the plurality of memory modules comprises a plurality of dynamic random access memory devices.

6. The apparatus of claim 1 wherein operational parameters set by the code logic include an offset relative to nominal operational parameters.

7. The apparatus of claim 1 wherein the code logic circuit is configured to provide code signals to set the operation parameters, wherein base code signals are adjusted to provide the code signals.

8. The apparatus of claim 1, further comprising a calibration circuit coupled to an external reference resistor, configured to perform a calibration operation by referencing an impedance of the external reference resistor and further configured to provide ZQ code signals based on the calibration operation.

9. An apparatus, comprising:
   a memory bus including a plurality of signal lines;
   a memory controller coupled to the memory bus and configured to provide control information to the memory bus; and
   a plurality of memory modules coupled to the memory bus and configured to receive the control information from the memory controller, each of the plurality of memory modules including a plurality of memory devices configured to receive location information indicative of a relative location of a respective memory module, each of the plurality of memory devices of a memory module including an input/output circuit configured to operate based on operational parameters and further including a code logic circuit configured to receive impedance code signals internally, and further configured to set operational parameters for the input/output circuit responsive to the impedance code signals, wherein the operational parameters for the input/output circuit are based at least in part on the location information for the respective memory module,
wherein the input/output circuit comprises an output driver circuit, the output driver circuit including adjustable impedance circuits and the operational parameters set an impedance of the output driver circuit.

10. An apparatus, comprising:
a memory bus including a plurality of signal lines;
a memory controller coupled to the memory bus and configured to provide control information to the memory bus; and
a plurality of memory modules coupled to the memory bus and configured to receive the control information from the memory controller, each of the plurality of memory modules including a plurality of memory devices configured to receive location information indicative of a relative location of a respective memory module, each of the plurality of memory devices of a memory module including an input/output circuit configured to operate based on operational parameters and further including a code logic circuit configured to receive impedance code signals internally, and further configured to set operational parameters for the input/output circuit responsive to the impedance code signals, wherein the operational parameters for the input/output circuit are based at least in part on the location information for the respective memory module,
wherein the input/output circuit comprises an output driver circuit and an input receiver circuit, and wherein the operational parameters for at least an impedance setting for the output driver circuit, an equalization setting for an input receiver circuit, or a termination impedance.

11. An apparatus, comprising:
a memory configured to be coupled to a memory bus, the memory including a plurality of memory modules, each of the plurality of modules including a plurality of memory devices, each of the plurality of memory devices comprising:
a memory cell array including a plurality of memory cells configured to store data; and
an input/output circuit configured to provide data to the memory cell array and further configured to receive data from the memory cell array, the input/output circuit including a code logic circuit configured to receive location information indicative of a location of the memory device and impedance code signals internally, to provide code signals based on the location information for setting operational parameters for the input/output circuit, and further configured to set the operational parameters responsive to the code signals and the impedance code signals,
wherein the code logic circuit is configured to receive base code signals and adjust the base code signals based on the information to provide the code signals.

12. The apparatus of claim 11 wherein the input/output circuit comprises an output driver circuit including adjustable impedances and the code signals set operational parameters of the adjustable impedances.

13. The apparatus of claim 11 wherein the input/output circuit comprises an input receiver circuit including equalization circuits and the code signals set operational parameters of reference levels of the equalization circuits.

14. The apparatus of claim 11 wherein the input/output circuit comprises a termination circuit including adjustable termination impedances and the code signals set operational parameters of the adjustable termination impedances.

15. The apparatus of claim 11,
wherein each of the plurality of memory devices further comprises a mode register including a plurality of registers and the information is programmed in the plurality of registers.

16. The apparatus of claim 11 wherein the information is indicative of a location of a memory module of the plurality of memory modules in which the plurality of memory devices are included.

17. The apparatus of claim 11,
wherein each of the plurality of memory modules includes an upper region and a lower region and the information is indicative of a memory device of the plurality of memory devices included in the upper or lower region.

18. An apparatus comprising:
a memory configured to be coupled to a memory bus, the memory including a plurality of memory modules, each of the plurality of modules including a plurality of memory devices, each of the plurality of memory devices comprising:
a memory cell array including a plurality of memory cells configured to store data; and
an input/output circuit configured to provide data to the memory cell array and further configured to receive data from the memory cell array, the input/output circuit including a code logic circuit configured to receive location information indicative of a location of the memory device and provide code signals based on the location information for setting operational parameters for the input/output circuit,
wherein the code logic circuit, comprises:
a translation circuit configured to store values related to the information and to provide the values when accessed;
control logic configured to receive the information and access the values stored in the translation circuit based on the information to provide control signals; and
a code adjustment circuit configured to receive base code signals and adjust the base code signals based on the control signals from the control logic to provide the code signals for setting operational parameters.

19. A method, comprising:
receiving at a memory device location information indicative of a physical location of the memory device; and
providing code signals for setting operational parameters for an input/output circuit, wherein base code signals are adjusted based on the location information to provide the code signals,
wherein the memory device includes an unused terminal and the location information is received by the memory device at the unused terminal, wherein the unused terminal comprises at least one of unused data terminal, TEN terminal, parity terminal, or power supply terminal.

20. The method of claim 19 wherein the memory device is included in a memory module and wherein the location information comprises a memory slot address.

21. The method of claim 19 wherein the unused terminal is configured during manufacturing to receive location information.

22. The method of claim 19 wherein the memory device is included in a memory module and wherein the location information is indicative of a region of the memory module in which the memory device is included.

23. A method comprising:
    receiving at a memory device location information indicative of a physical location of the memory device;
    receiving impedance code signals internally;
    providing code signals for setting operational parameters for an input/output circuit, wherein base code signals are adjusted based on the location information to provide the code signals; and
    setting operational parameters for an input/output circuit responsive to the impedance code signals and the code signals,
    wherein the location information is programmed in a mode register included in the memory.

* * * * *